US012707846B2

(12) United States Patent
Lee et al.

(10) Patent No.: US 12,707,846 B2
(45) Date of Patent: Aug. 11, 2026

(54) DISPLAY DEVICE

(71) Applicant: Samsung Display Co., Ltd, Yongin-si (KR)

(72) Inventors: Arong Lee, Hwaseong-si (KR); Jin Goo Kang, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 193 days.

(21) Appl. No.: 17/171,957

(22) Filed: Feb. 9, 2021

(65) Prior Publication Data

US 2021/0257418 A1 Aug. 19, 2021

(30) Foreign Application Priority Data

Feb. 14, 2020 (KR) ........................ 10-2020-0018142

(51) Int. Cl.
*H10K 59/35* (2023.01)
*H10K 59/122* (2023.01)
*H10K 59/131* (2023.01)

(52) U.S. Cl.
CPC ......... *H10K 59/352* (2023.02); *H10K 59/122* (2023.02); *H10K 59/131* (2023.02)

(58) Field of Classification Search
CPC ............. H01L 27/3216; H01L 27/3246; H01L 27/326; H01L 27/3276; H01L 27/3265; H01L 2251/558; H10K 59/1213; H10K 59/121; H10K 59/352; H10K 59/131; H10K 59/122; H10K 59/1216; H10K 2102/351
See application file for complete search history.

(56) References Cited

U.S. PATENT DOCUMENTS

| | | | |
|---|---|---|---|
| 10,665,648 | B2 | 5/2020 | Paek et al. |
| 10,734,451 | B2 | 8/2020 | Park et al. |
| 2015/0249115 | A1 | 9/2015 | Chen et al. |
| 2017/0287986 | A1 | 10/2017 | Jeong et al. |

(Continued)

FOREIGN PATENT DOCUMENTS

| | | | |
|---|---|---|---|
| CN | 103219359 | A | 7/2013 |
| CN | 107275369 | A | 10/2017 |

(Continued)

OTHER PUBLICATIONS

Chinese Office Action corresponding to CN Application No. 202110116825.X, dated Mar. 31, 2026 (11 pages).

*Primary Examiner* — Vongsavanh Sengdara
(74) *Attorney, Agent, or Firm* — Womble Bond Dickinson (US) LLP

(57) ABSTRACT

A display device including a pixel includes: a substrate; a first pattern disposed on the substrate; a conductive, second pattern disposed on the first pattern and partially overlapping the first pattern; a conductive, third pattern disposed on the second pattern and partially overlapping the second pattern; a conductive, fourth pattern disposed on the third pattern and partially overlapping the third pattern, wherein the first pattern, the second pattern, the third pattern, and the fourth pattern overlap each other in a first area of the pixel; a pixel defining layer disposed on the fourth pattern and including a first opening overlapping a second area of the pixel without overlapping the first area; and a first emission layer to emit light having a blue color, the first emission layer disposed in the first opening.

11 Claims, 21 Drawing Sheets

(56) References Cited

U.S. PATENT DOCUMENTS

| | | | | |
|---|---|---|---|---|
| 2018/0076273 | A1 | 3/2018 | Kim et al. | |
| 2018/0197922 | A1 | 7/2018 | Song | |
| 2019/0131371 | A1* | 5/2019 | Yi | H10K 59/1213 |
| 2019/0206949 | A1* | 7/2019 | Park | H10K 59/352 |
| 2020/0194522 | A1* | 6/2020 | Lee | H10K 71/233 |

FOREIGN PATENT DOCUMENTS

| | | | |
|---|---|---|---|
| CN | 109065568 | A | 12/2018 |
| CN | 110400827 | A | 11/2019 |
| KR | 10-1787978 | | 3/2005 |
| KR | 10-2005-0000131 | | 10/2017 |
| KR | 10-2017-0115156 | A | 10/2017 |
| KR | 20180030363 | | 3/2018 |
| KR | 10-2018-0083020 | A | 7/2018 |
| KR | 20190079948 | | 7/2019 |
| KR | 20190081491 | | 7/2019 |

* cited by examiner

DISPLAY DEVICE

CROSS-REFERENCE TO RELATED APPLICATION

This application claims priority from and the benefit of Korean Patent Application No. 10-2020-0018142, filed on Feb. 14, 2020, which is hereby incorporated by reference for all purposes as if fully set forth herein.

BACKGROUND

Field

The invention relates generally to a display device, and more particularly, to a display device including an emission layer.

Discussion of the Background

A display device includes a plurality of pixels to display an image. In general, each of the pixels may include three sub-pixels. The sub-pixel may include an emission layer and a wiring layer disposed under the emission layer. The emission layer may emit light having a predetermined color by receiving a driving current from the wiring layer. The pixel may display a color in which colors of lights emitted from the sub-pixels are combined.

The wiring layer may include a plurality of wirings that are sequentially disposed, and as the wirings partially overlap, a difference in height called a "step" may be formed on a top surface of the wiring layer.

The above information disclosed in this Background section is only for understanding of the background of the inventive concepts, and, therefore, it may contain information that does not constitute prior art.

SUMMARY

Applicant discovered that the emission layer, which is disposed on the wiring layer, may not have a substantially uniform and/or substantially constant thickness due to the step of the wiring layer. Accordingly, color characteristics of light emitted from the sub-pixel of the display device may deteriorate. As the color characteristics of the sub-pixel deteriorate, the quality of the color displayed by the pixel also may deteriorate. Accordingly, the display quality of the display device may deteriorate.

Display devices constructed according to the principles and exemplary implementations of the invention have improved the display quality. For example, the display device may include a first emission layer overlapping a first area of a pixel without overlapping a second area of the pixel in which patterns forming at least a portion of a circuit of the pixel, such as a transistor and a capacitor, are disposed. More specifically, the display device may include a pixel defining layer having a first opening with the first emission layer being disposed in the first opening wherein the first opening does not overlap the second area. In the second area, a semi-conductive pattern and three conductive patterns may overlap each other. This may allow the first emission layer to have a relatively uniform thickness, and therefore color characteristics of the light of the first emission layer may be improved. Accordingly, the color characteristic of the light of the pixel may also be improved, thereby improving the display quality of the display device.

In addition, according to the principles and some exemplary implementations of the invention have the pixel defining layer may further include second and third openings, second and third emission layers may be disposed in the second and third openings, and the area of the first opening may be larger than the area of each of the second and third openings. Accordingly, the amount of current per unit area for the first emission layer to emit light of a certain luminance may be relatively low, thereby improving the life span of the first emission layer.

Additional features of the inventive concepts will be set forth in the description which follows, and in part will be apparent from the description, or may be learned by practice of the inventive concepts.

According to one aspect of the invention, a display device including a pixel includes: a substrate; a first pattern disposed on the substrate; a conductive, second pattern disposed on the first pattern and partially overlapping the first pattern; a conductive, third pattern disposed on the second pattern and partially overlapping the second pattern; a conductive, fourth pattern disposed on the third pattern and partially overlapping the third pattern, wherein the first pattern, the second pattern, the third pattern, and the fourth pattern overlap each other in a first area of the pixel; a pixel defining layer disposed on the fourth pattern and including a first opening overlapping a second area of the pixel without overlapping the first area; and a first emission layer to emit light having a blue color, the first emission layer disposed in the first opening.

The first area may include an overlap area, and the pixel defining layer may further include: a second opening overlapping the overlap area and being spaced apart from the first opening; and a third opening overlapping the overlap area and being spaced apart from the first opening and the second opening.

The first opening may have a third area, and the second opening may have a fourth area and the third opening may have a fifth area with the third area being larger than the fourth area and larger than the fifth area.

The first opening may have a third area, and the second opening may have a fourth area and the third opening may have a fifth area with the fourth area being substantially the same as the fifth area.

The display device may further include: a second emission layer to emit light having a red color, the second emission layer being disposed in the second opening; and a third emission layer to emit light having a green color, the third emission layer being disposed in the third opening.

The first to third emission layers may have top surfaces that are substantially flat.

The first area may include an overlap area, and the pixel defining layer may further includes: a second opening overlapping the second area without overlapping the overlap area and being spaced apart from the first opening; and a third opening overlapping the overlap area and being spaced apart from the first opening and the second opening.

The first opening may have a third area, and the second opening may have a fourth area and the third opening may have a fifth area with the fifth area being larger than the third area and larger than the fourth area.

The first opening may have a third area, and the second opening may have a fourth area and the third opening may have a fifth area with the third area being substantially the same as the fourth area.

The display device may further include: a second emission layer to emit light having a red color, the second emission layer being disposed in the second opening; and a third emission layer to emit light having a green color, the third emission layer being disposed in the third opening.

The first to third emission layers may have top surfaces that are substantially flat.

The display device may further include: a second emission layer to emit light having a green color, the second emission layer being disposed in the second opening; and a third emission layer to emit light having a red color, the third emission layer being disposed in the third opening.

The first to third emission layers may have top surfaces that are substantially flat.

The first area may include an overlap area, and the pixel defining layer may further includes: a second opening overlapping the second area without overlapping the overlap area and being spaced apart from the first opening; and a third opening overlapping the second area without overlapping the overlap area and being spaced apart from the first opening and the second opening.

The first opening may have a third area, and the second opening may have a fourth area and the third opening may have a fifth area with the third area being larger than the fourth area and larger than the fifth area.

The first opening may have a third area, and the second opening may have a fourth area and the third opening may have a fifth area with the fourth area being substantially the same as the fifth area.

The display device may further include: a second emission layer to emit light having a red color, the second emission layer being disposed in the second opening; and a third emission layer to emit light having a green color, the third emission layer being disposed in the third opening.

The first pattern may include an active pattern of a driving transistor of the pixel, the second pattern may include a gate electrode of the driving transistor, the third pattern may include a capacitor electrode constituting a capacitor together with the gate electrode, and the fourth pattern may include a connecting wire connecting the driving transistor and a compensation transistor of the pixel.

The fourth pattern may contact the second pattern.

The capacitor electrode may include a hole overlapping the second and fourth patterns, and the fourth pattern may contact the second pattern through the hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
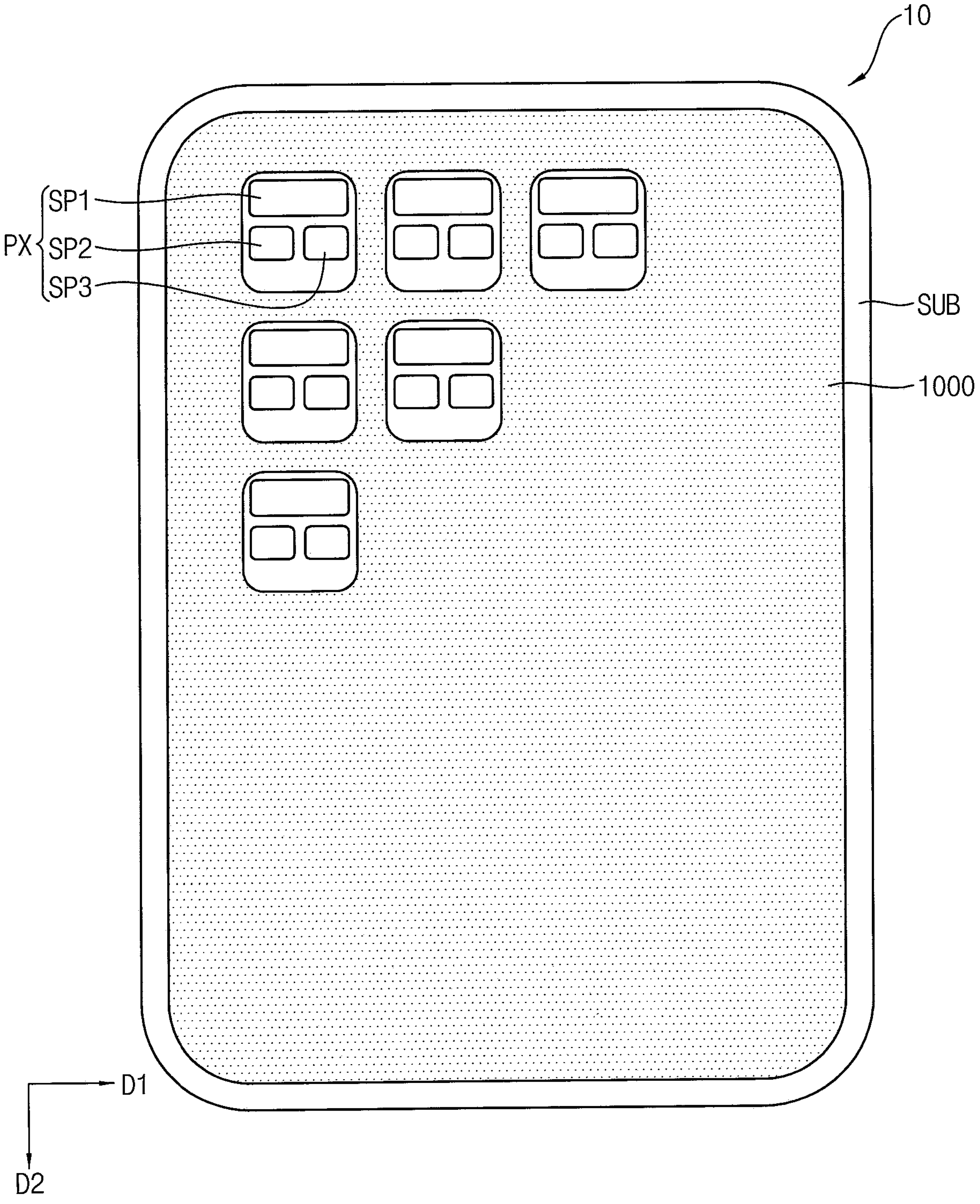
FIG. 1 is a plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being “on,” “connected to,” or “coupled to” another element or layer, it may be directly on, connected to, or coupled to the other element or layer or intervening elements or layers may be present. When, however, an element or layer is referred to as being “directly on,” “directly connected to,” or “directly coupled to” another element or layer, there are no intervening elements or layers present. To this end, the term “connected” may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, “at least one of X, Y, and Z” and “at least one selected from the group consisting of X, Y, and Z” may be construed as X only, Y only, Z only, or any combination of two or more of X, Y, and Z, such as, for instance, XYZ, XYY, YZ, and ZZ. As used herein, the term “and/or” includes any and all combinations of one or more of the associated listed items.

Although the terms “first,” “second,” etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as “beneath,” “below,” “under,” “lower,” “above,” “upper,” “over,” “higher,” “side” (e.g., as in “sidewall”), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as “below” or “beneath” other elements or features would then be oriented “above” the other elements or features. Thus, the exemplary term “below” can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, “a,” “an,” and “the” are intended to include the plural forms as well, unless the context clearly indicates otherwise. Moreover, the terms “comprises,” “comprising,” “includes,” and/or “including,” when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms “substantially,” “about,” and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
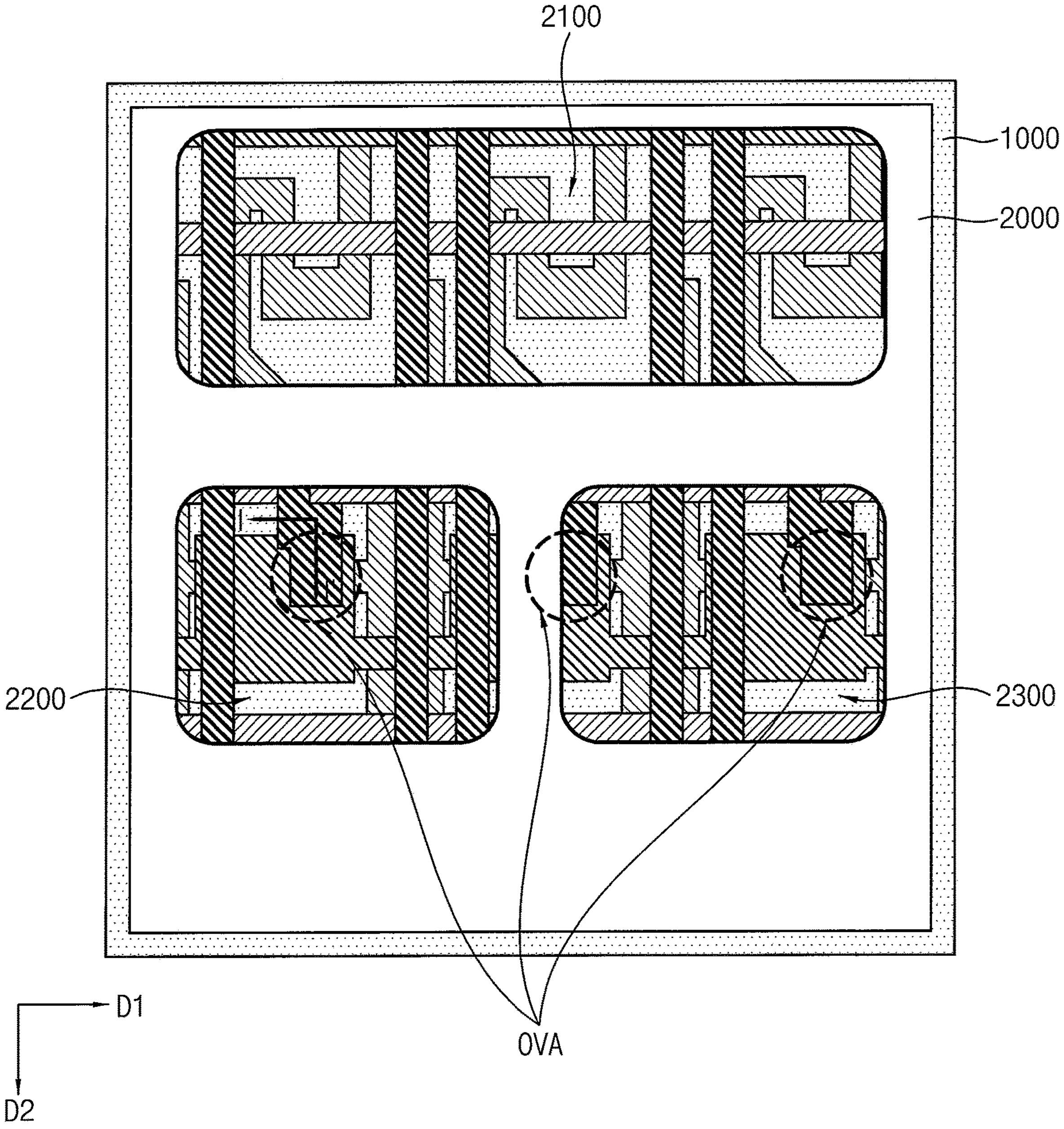
FIG. 2 is a plan view of an exemplary embodiment of some of layers of the pixel of FIG. 1.

FIG. 1 is a plan view of an exemplary embodiment of a display device constructed according to the principles of the invention. FIG. 2 is a plan view of an exemplary embodiment of some of layers of the pixel of FIG. 1.

Referring to FIGS. 1 and 2, a display device 10 may include a substrate SUB, a wiring layer 1000, and a pixel defining layer 2000. The wiring layer 1000 may be disposed on the substrate SUB and the pixel defining layer 2000 may be disposed on the wiring layer 1000.

A plurality of pixels PX may be disposed in the display device 10 and the pixel PX may include a first sub-pixel SP1, a second sub-pixel SP2, and a third sub-pixel SP3. The first sub-pixel SP1, the second sub-pixel SP2, and the third sub-pixel SP3 may emit lights having predetermined colors, respectively. For example, the first sub-pixel SP1 may emit a light having a blue color, the second sub-pixel SP2 may emit a light having a red color, and a third sub-pixel SP3 may emit a light having a green color. The pixel PX may display a color in which colors of lights emitted from the first to third sub-pixels SP1, SP2, and SP3 are combined.

The substrate SUB may include a transparent or an opaque material. For example, the substrate SUB may be a glass substrate, a quartz substrate, a plastic substrate, or the like. For example, when the substrate SUB is the plastic substrate, the substrate SUB may include polyimide, polyethylene naphthalate, polyethylene terephthalate, polyarylate, polycarbonate, polyetherimide, polyethersulfone, etc.

A circuit layer to drive emission layers of the pixel PX may be provided in the form of the wiring layer 1000. The wiring layer 1000 may be disposed on the substrate SUB. The wiring layer 1000 may include a plurality of patterns forming elements of a circuit, such as a transistor and a capacitor, for the pixel PX. For example, the wiring layer 1000 may include first to fourth patterns each of which is conductive or semi-conductive. In an exemplary embodiment, the first to fourth patterns may partially overlap each other in a first area of the pixel PX, such as an overlap area OVA shown in FIG. 2. Each of the first to fourth patterns may be disposed in the overlap area OVA. On the other hand, a second area of the pixel PX that is an area other than the first area of the pixel PX may be defined. For example, the second area of the pixel PX, which may be in the form of a non-overlap area, may be include an area in which none of the first to fourth patterns are disposed, an area in which any one of the first to fourth patterns is disposed, an area in which two of the first to fourth patterns are disposed, and an area in which three of the first to fourth patterns are disposed. In the overlap area OVA, as all of the first to fourth patterns overlap, the wiring layer 1000 may be relatively thick in the overlap area OVA and therefore the wiring layer 1000 and/or the layer disposed above the wiring layer 1000 may have difference in height at a step (e.g., a step STP in FIG. 12) formed around the overlap area OVA.

The pixel defining layer 2000 may be disposed on the wiring layer 1000. The pixel defining layer 2000 may include first to third openings 2100, 2200, and 2300 penetrating the pixel defining layer 2000. For example, a first emission layer (e.g., the first emission layer 3210 in FIG. 13) may be disposed in the first opening 2100, a second emission layer (e.g., the second emission layer 3220 in FIG. 14) may be disposed in the second opening 2200, and a third emission layer may be disposed in the third opening 2300. In an exemplary embodiment, the first to third emission layers may be formed using an inkjet printing device. In this case, top surfaces of the first to third emission layers may be substantially flat.

In an exemplary embodiment, the first opening 2100 may not overlap the overlap area OVA. The second opening 2200 may overlap the overlap area OVA and may be spaced apart from the first opening 2100. The third opening 2300 may overlap the overlap area OVA and may be spaced apart from the first and second openings 2100 and 2200.

In this case, the step may be formed on bottom surfaces of the second and third emission layers due to the step formed around the overlap area OVA. Accordingly, the thickness of each of the second and third emission layers may not be substantially constant and/or substantially uniform. For example, the thickness of the second emission layer overlapping the overlap area OVA may be less than the thickness of the second emission layer overlapping the non-overlap area. In addition, the thickness of the third emission layer overlapping the overlap area OVA may be less than the thickness of the third emission layer overlapping the non-overlap area. As the thickness of each of the second and third emission layers is not substantially constant and/or substantially uniform, color characteristics of lights emitted from the second emission layer and the third emission layer may be relatively deteriorated. For example, the color characteristic may mean light luminance, color coordinates, and the like.

Figure 10:
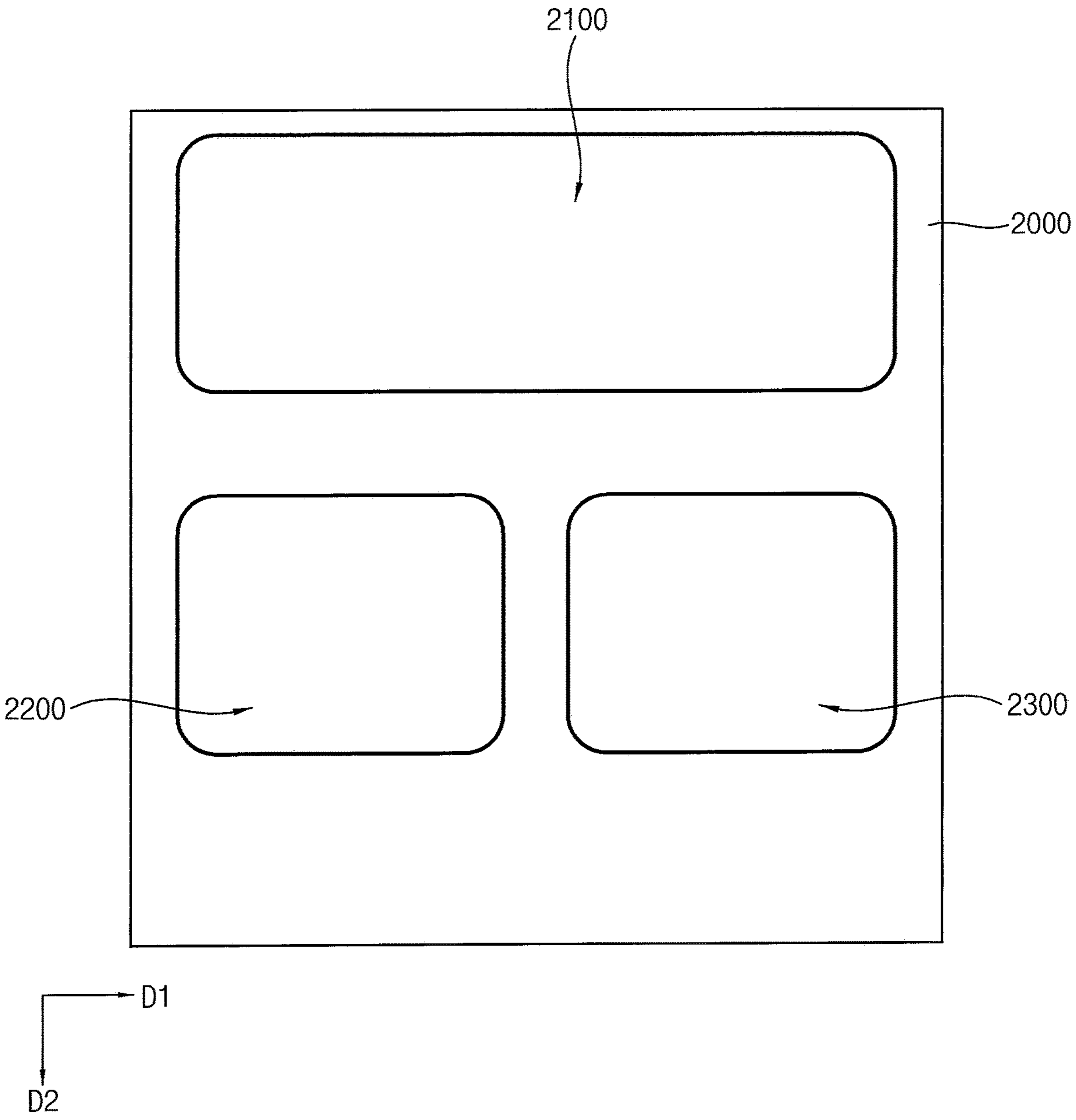
FIG. 10 is a plan view of the pixel defining layer of FIG. 2.
Figure 11:
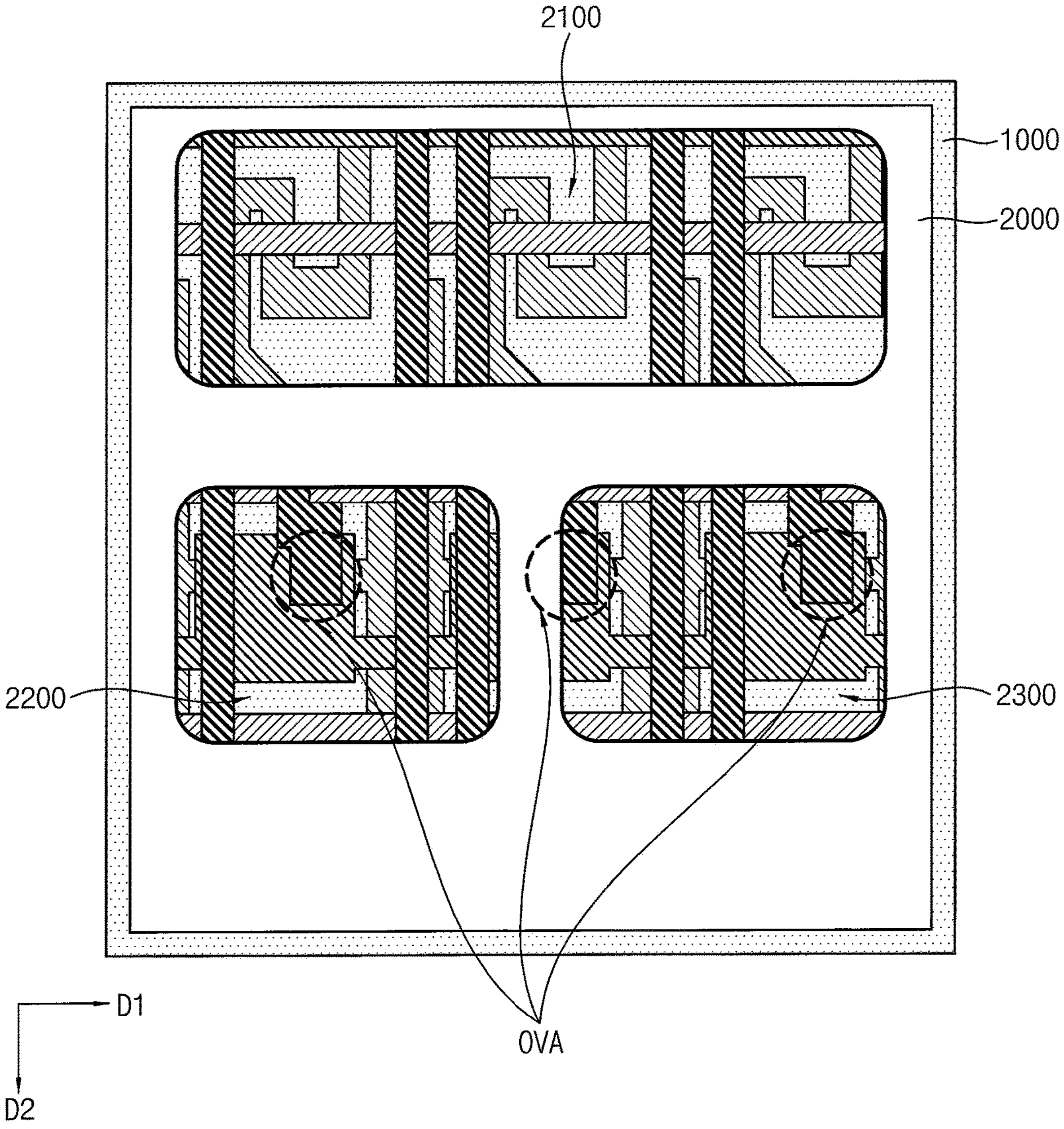
FIG. 11 is a plan view of the pixel defining layer disposed on the wiring layer of FIG. 9.

FIGS. 3 to 9 are plan views of some of the layers of the wiring layer of FIG. 2. FIG. 10 is a plan view of the pixel defining layer of FIG. 2. FIG. 11 is a plan view of the pixel defining layer disposed on the wiring layer of FIG. 9.

Figure 3:
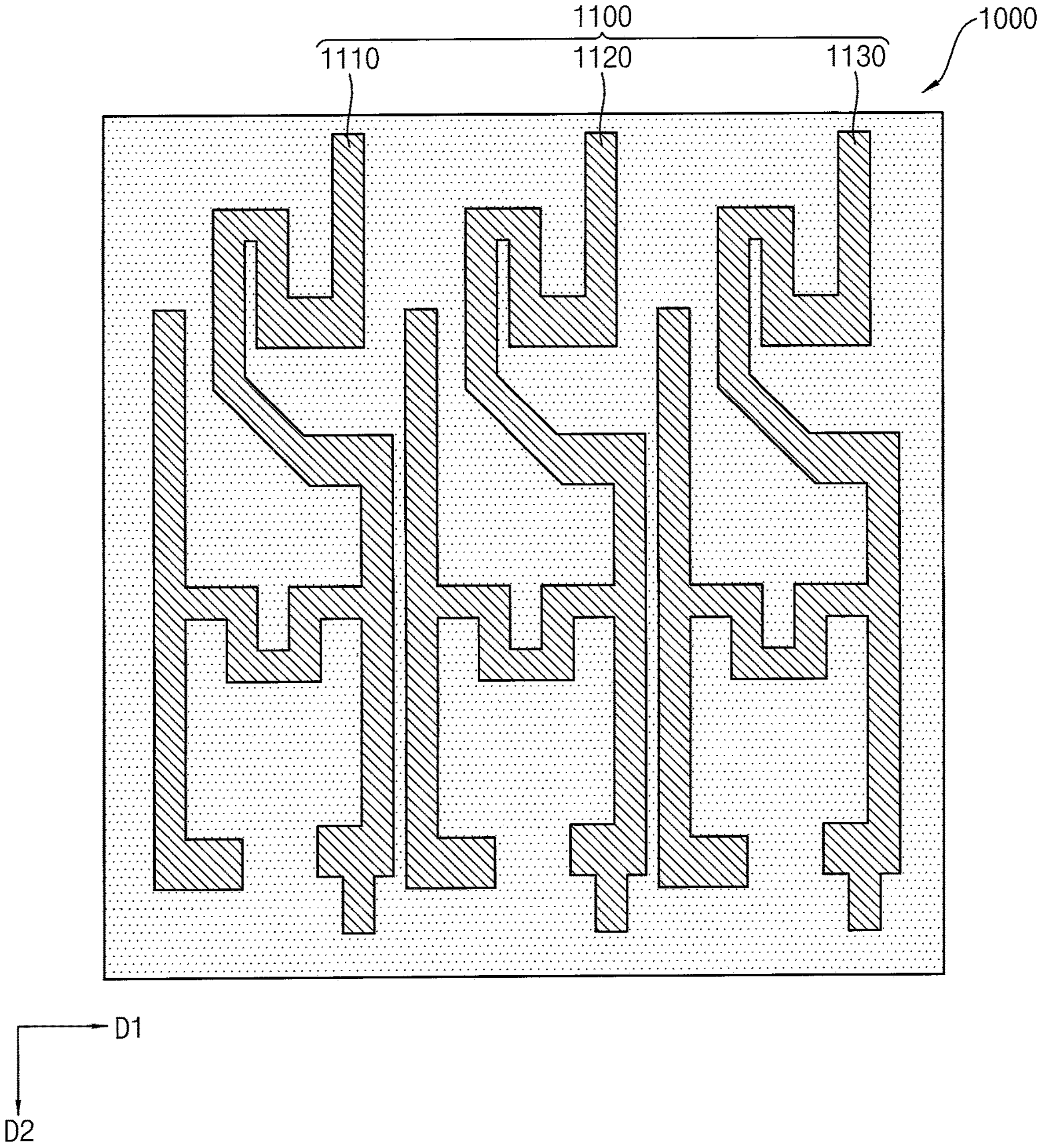
FIGS. 3 to 9 are plan views of some of the layers of the wiring layer of FIG. 2.

Referring to FIGS. 2 and 3, the wiring layer 1000 may include a semi-conductive, first pattern such as a first semi-conductive pattern 1100. The first semi-conductive pattern 1100 may include a semi-conductive material able to function as an active region, such as a channel region of a transistor.

In an exemplary embodiment, the first semi-conductive pattern 1100 may include a first active pattern 1110, a second active pattern 1120, and a third active pattern 1130. The first active pattern 1110, the second active pattern 1120, and the third active pattern 1130 may be disposed along a first direction D1 parallel to a row direction.

Each of the first active pattern 1110, the second active pattern 1120, and the third active pattern 1130 may extend in the first direction D1, in a second direction D2 perpendicular to the first direction D1, and in an arbitrary direction between the first direction D1 and the second direction D2.

In an exemplary embodiment, the first active pattern 1110 may be configured to provide a driving current to the first emission layer of the first sub-pixel SP1 of FIG. 1. The second active pattern 1120 may be configured to provide a driving current to the second emission layer of the second sub-pixel SP2 of FIG. 1. The third active pattern 1130 may be configured to provide a driving current to the third emission layer of the third sub-pixel SP3 of FIG. 1.

For example, the first semi-conductive pattern 1100 may include amorphous silicon, polycrystalline silicon, or oxide silicon. The first semi-conductive pattern 1100 may be divided into source regions and drain regions doped with impurities, and channel regions between the source regions and the drain regions.

A first insulating layer (e.g., a first insulating layer GI_1 of FIG. 13) may be disposed on the first semi-conductive pattern 1100. The first insulating layer may cover the first semi-conductive pattern 1100 and may be disposed to have a predetermined thickness along a profile of the first semi-conductive pattern 1100. For example, the first insulating layer may include an inorganic material such as silicon oxide, silicon nitride, or metal oxide.

Figure 4:
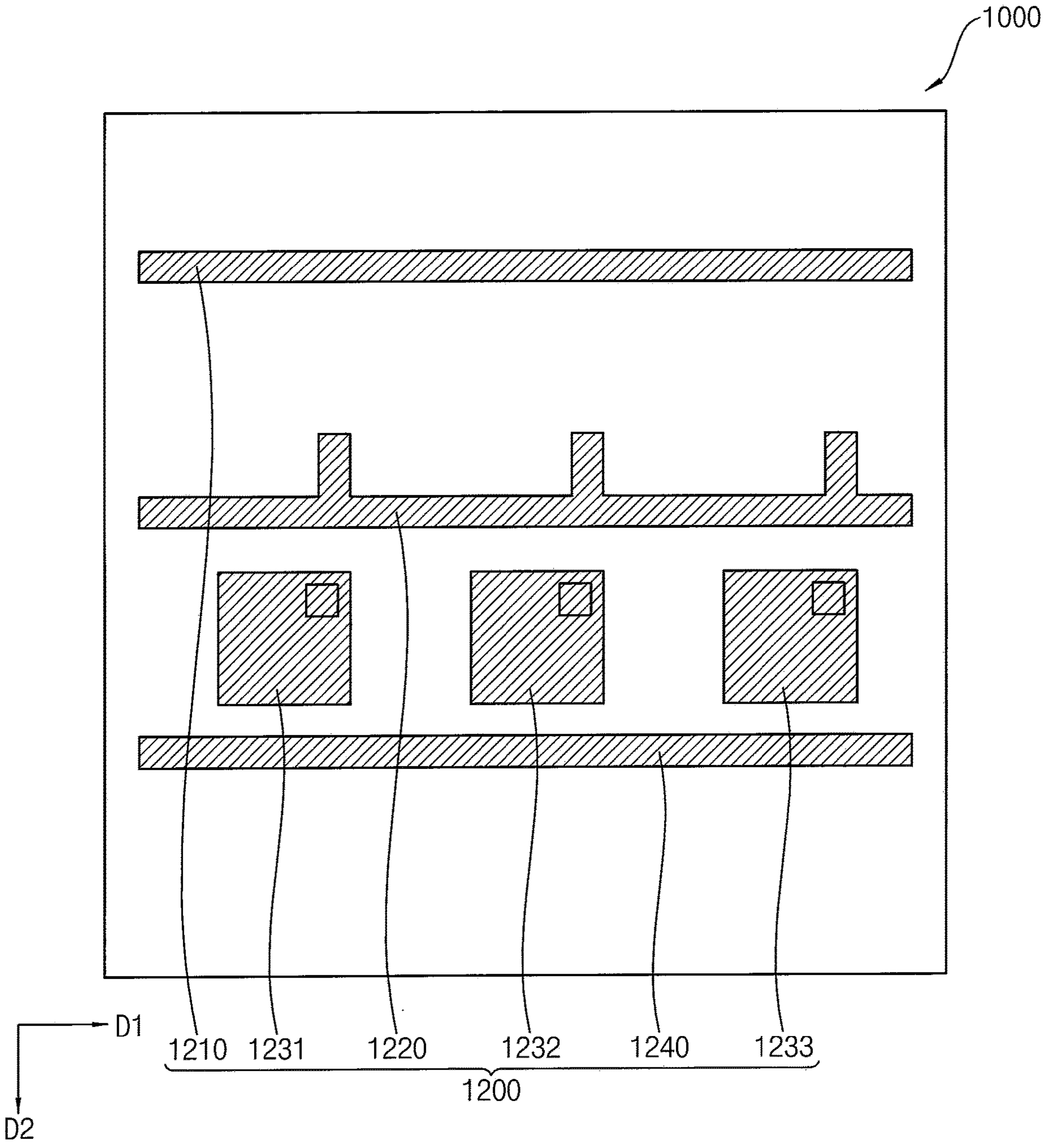
Figure 5:
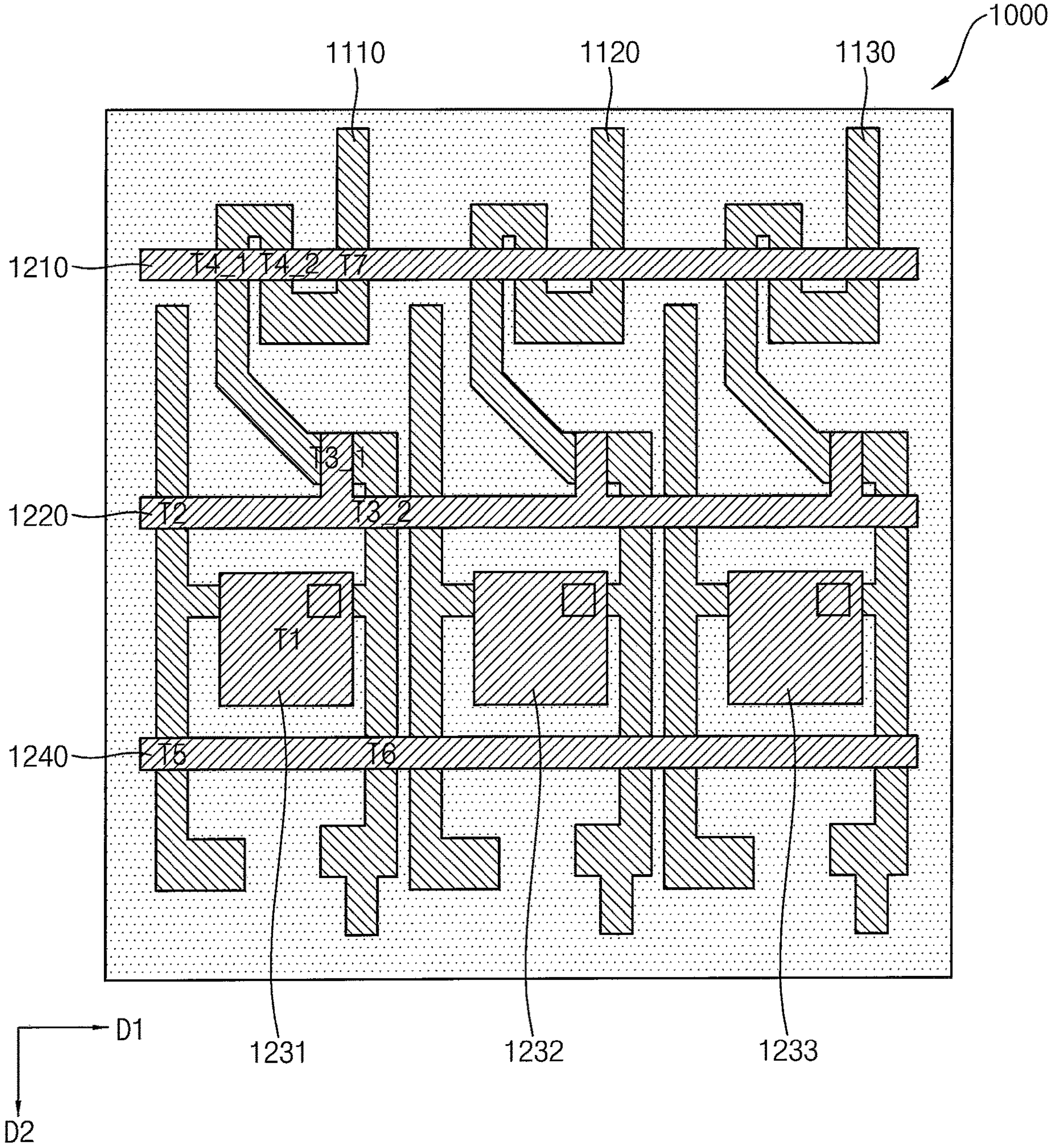

Referring to FIGS. 2, 4, and 5, a second pattern such as a second conductive pattern 1200 may be disposed on the first insulating layer. The second conductive pattern 1200 may partially overlap the first semi-conductive pattern 1100 as shown in FIG. 5. For example, the second conductive pattern 1200 may overlap the channel regions of the first semi-conductive pattern 1100.

In an exemplary embodiment, the second conductive pattern 1200 may include a first gate wire 1210, a second gate wire 1220, a first gate electrode 1231, a second gate electrode 1232, a third gate electrode 1233, and a third gate wire 1240. The first gate wire 1210, the second gate wire 1220, and the third gate wire 1240 may extend in the first direction D1. The first gate electrode 1231, the second gate electrode 1232, and the third gate electrode 1233 may be disposed along the first direction D1.

The first gate wire 1210, the second gate wire 1220, the first gate electrode 1231, and the third gate wire 1240, which overlap the first active pattern 1110, may be configured to provide the driving current to the first emission layer of the first sub-pixel SP1.

The first gate wire 1210, the second gate wire 1220, the second gate electrode 1232, and the third gate wire 1240, which overlap the second active pattern 1120, may be configured to provide the driving current to the second emission layer of the second sub-pixel SP2.

The first gate wire 1210, the second gate wire 1220, the third gate electrode 1233, and the third gate wire 1240, which overlap the third active pattern 1130, may be configured to provide the driving current to the third emission layer of the third sub-pixel SP3.

In an exemplary embodiment, the first gate wire 1210, the second gate wire 1220, the first gate electrode 1231, the second gate electrode 1232, the third gate electrode 1233, and third gate wire 1240 may include a metal, an alloy, a conductive metal oxide, a transparent conductive material, or the like. For example, the first gate wire 1210, the second gate wire 1220, the first gate electrode 1231, the second gate electrode 1232, the third gate electrode 1233, and the third gate wire 1240 may include gold (Au), silver (Ag), aluminum (Al), platinum (Pt), nickel (Ni), titanium (Ti), palladium (Pd), magnesium (Mg), and calcium. (Ca), lithium (Li), chromium (Cr), tantalum (Ta), molybdenum (Mo), scandium (Sc), neodymium (Nd), iridium (Ir), an alloy containing aluminum, containing silver Alloys, tungsten (W), alloys containing copper, alloys containing molybdenum, zinc oxide (ZnOx), indium tin oxide (ITO), indium zinc oxide (IZO), and the like.

As shown in FIG. 5, the first semi-conductive pattern 1100 and the second conductive pattern 1200 may constitute a plurality of transistors. For example, the first active pattern 1110, the first gate wire 1210, the second gate wire 1220, the first gate electrode 1231 and the third gate wire 1240 may constitute first to seventh transistors T1, T2, T3_1, T3_2, T4_1, T4_2, T5, T6, and T7 of the first sub-pixel SP1.

A portion of the first active pattern 1110 and the first gate electrode 1231 may constitute the first transistor T1. In an exemplary embodiment, the first transistor T1 may be a driving transistor that generates the driving current provided to the first emission layer.

A portion of the first active pattern 1110 and a portion of the second gate wire 1220 may constitute the second transistor T2. In an exemplary embodiment, the second transistor T2 may provide a data voltage to the first transistor T1 in response to a scan signal.

A portion of the first active pattern 1110 and a portion of the second gate wire 1220 may constitute the third transistors T3_1 and T3_2. The third transistors T3_1 and T3_2 may be connected in series and may operate as a dual transistor. In an exemplary embodiment, the third transistors T3_1 and T3_2 may be compensation transistors that compensate for a threshold voltage of the first transistor T1. To this end, the portion of the first active pattern 1110 and the first gate electrode 1231 may be electrically connected each other. For example, the portion of the first active pattern 1110 and the first gate electrode 1231 may contact a connecting wire (e.g., the connecting wire 1431 of FIG. 9).

A portion of the first active pattern 1110 and a portion of the first gate wire 1210 may constitute the fourth transistors T4_1 and T4_2. The fourth transistors T4_1 and T4_2 may be connected in series and may operate as a dual transistor. The fourth transistors T4_1 and T4_2 may initialize the first transistor T1 in response to an initialization signal.

A portion of the first active pattern 1110 and a portion of the third gate wire 1240 may constitute the fifth transistor T5. The fifth transistor T5 may provide a high power voltage to the first transistor T1 in response to an emission control signal.

A portion of the first active pattern 1110 and a portion of the third gate wire 1240 may constitute the sixth transistor T6. The sixth transistor T6 may transmit the driving current to the first emission layer in response to the emission control signal.

A portion of the first active pattern 1110 and a portion of the first gate wire 1210 may constitute the seventh transistor T7. The seventh transistor T7 may initialize an anode terminal (e.g., a first electrode 3110 of FIG. 13) of an organic light emitting diode in response to the initialization signal.

The second active pattern 1120, the first gate wire 1210, the second gate wire 1220, the second gate electrode 1232, and the third gate wire 1240 may constitute first to seventh transistors T1, T2, T3_1, T3_2, T4_1, T4_2, T5, T6, and T7 of the sub-pixel SP2. In addition, the third active pattern 1130, the first gate wire 1210, the second gate wire 1220, the third gate electrode 1233, and the third gate wire 1240 may constitute first to seventh transistors T1, T2, T3_1, T3_2, T4_1, T4_2, T5, T6, and T7 of the sub-pixel SP3.

A second insulating layer (e.g., a second insulating layer GI_2 of FIG. 13) may be disposed on the second conductive pattern 1200. The second insulating layer may cover the second conductive pattern 1200 and may be disposed to have a predetermined thickness along a profile of the second conductive pattern 1200. For example, the second insulating layer may include an inorganic material such as silicon oxide, silicon nitride, or metal oxide.

Figure 6:
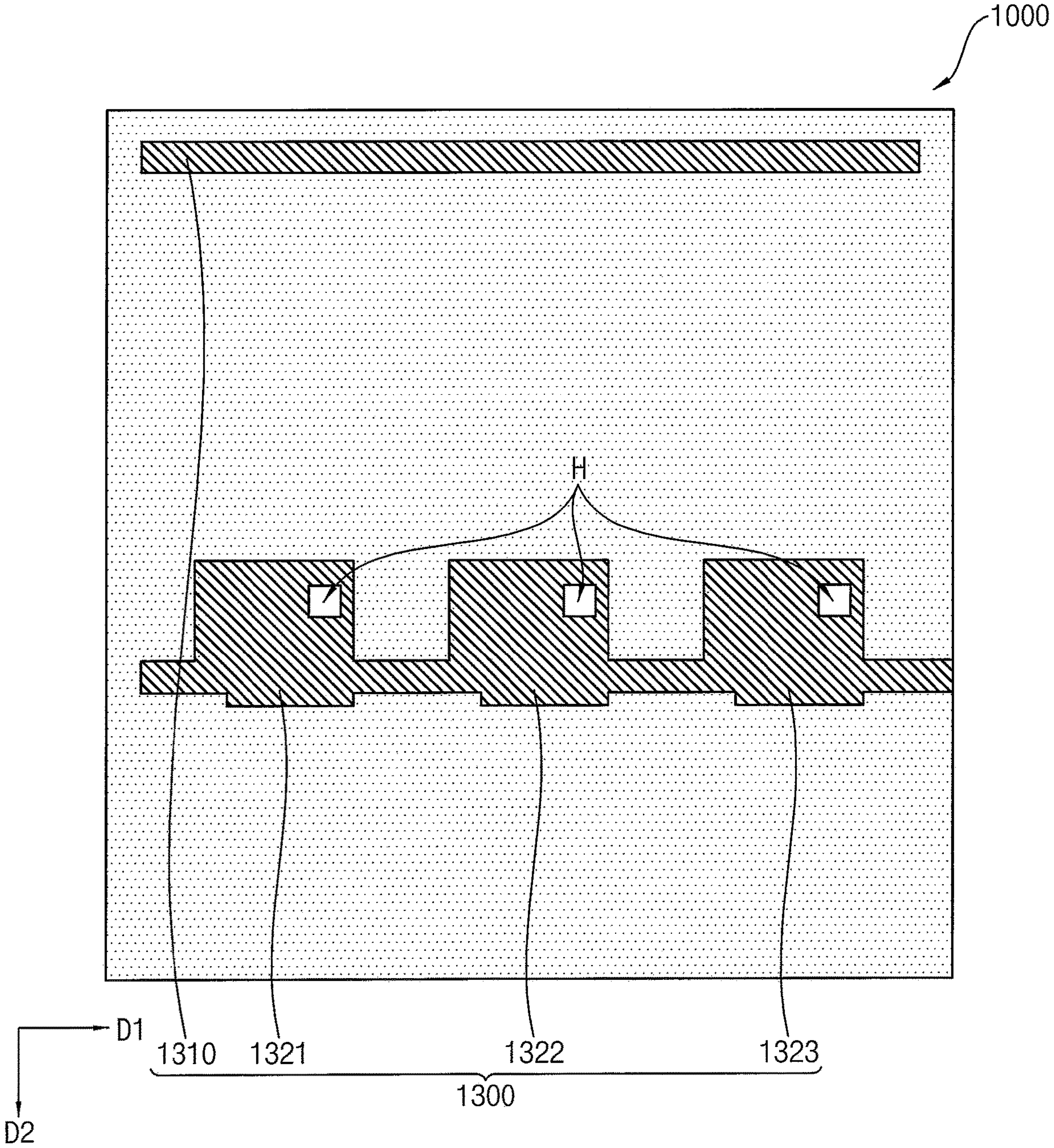
Figure 7:
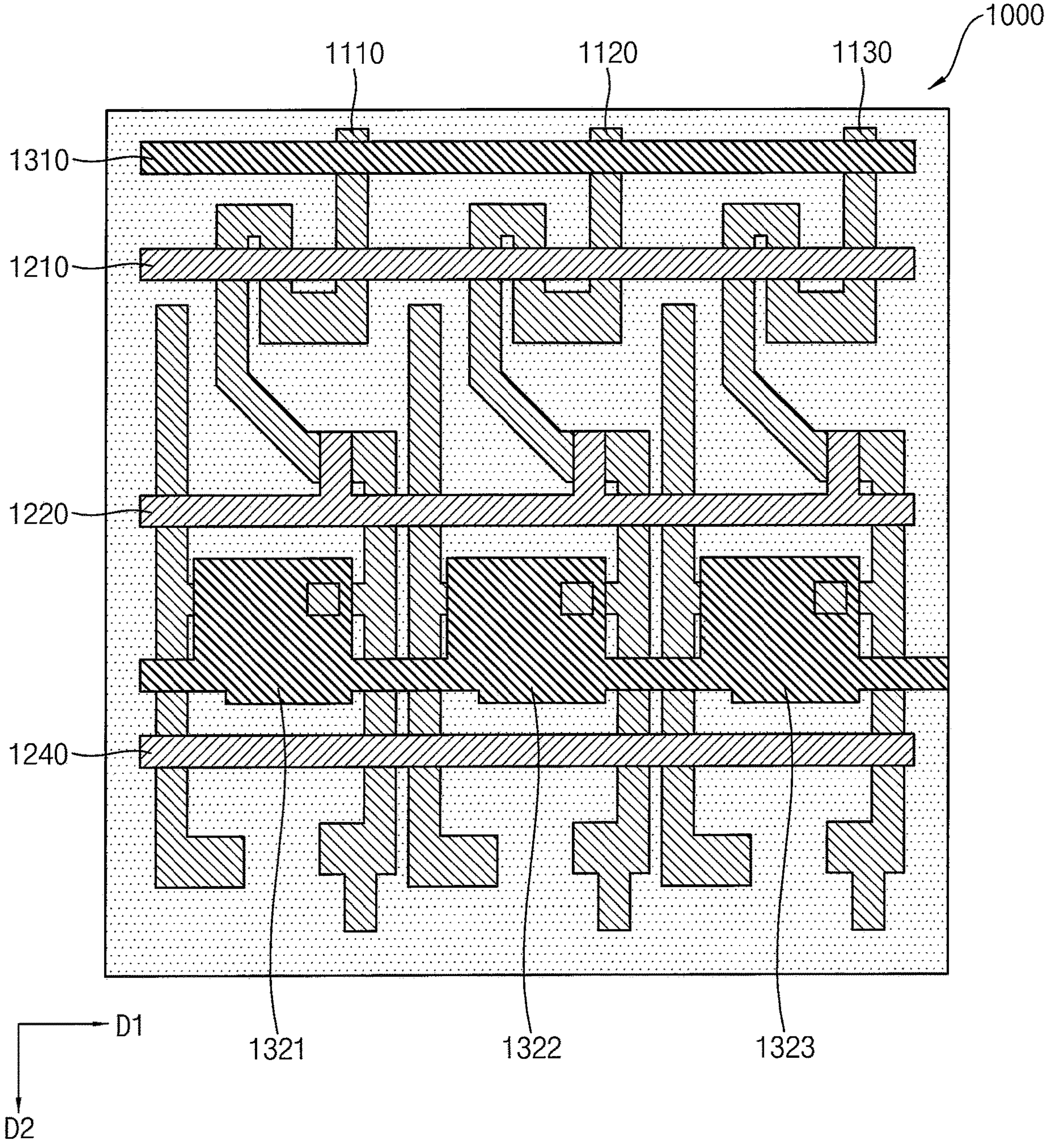

Referring to FIGS. 2, 6, and 7, a third pattern such as a third conductive pattern 1300 may be disposed on the second insulating layer. The third conductive pattern 1300 may partially overlap the first semi-conductive pattern 1100 and/or the second conductive pattern 1200 as shown in FIG. 7.

In an exemplary embodiment, the third conductive pattern 1200 may include an initialization voltage wire 1310, a first capacitor electrode 1321, a second capacitor electrode 1322, and a third capacitor electrode 1323. The initialization voltage wire 1310 may extend in the first direction D1. The first capacitor electrode 1321, the second capacitor electrode 1322, and the third capacitor electrode 1323 may be disposed along the first direction D1.

The initialization voltage wire 1310 may provide the initialization voltage to the fourth transistors T4_1 and T4_2.

The first capacitor electrode 1321 may constitute a capacitor of the first sub-pixel SP1 together with the first gate electrode 1231. The capacitor may maintain a voltage level of the first gate electrode 1231 and the first transistor T1 may generate the driving current based on the voltage level. In an exemplary embodiment, the first capacitor electrode 1321 may include a hole H overlapping the first gate electrode 1231 and the connecting wire. The connecting wire may electrically connect the first transistor T1 to the third transistors T3_1 and T3_2 through the hole H.

The second capacitor electrode 1322 may constitute a capacitor of the second sub-pixel SP2 together with the second gate electrode 1232 and the third capacitor electrode 1323 may constitute a capacitor of the third sub-pixel SP3 together with the third gate electrode 1232. Each of the second and third capacitor electrodes 1322 and 1323 may include a hole H that is substantially a same as the hole H.

In an exemplary embodiment, the first capacitor electrode 1231, the second capacitor electrode 1232, and the third capacitor electrode 1233 may overlap the overlap area OVA.

In an exemplary embodiment, each of the initialization wire 1310, the first capacitor electrode 1231, the second capacitor electrode 1232, and the third capacitor electrode 1233 may include a metal, an alloy, a conductive metal oxide, a transparent conductive material, or the like.

A third insulating layer (e.g., a third insulating layer ILD of FIG. 13) may be disposed on the third conductive pattern 1300. The third insulating layer may cover the third conductive pattern 1300 and may be disposed to have a predetermined thickness along a profile of the third conductive pattern 1300. For example, the third insulating layer may include an inorganic material such as silicon oxide, silicon nitride, or metal oxide.

Figure 8:
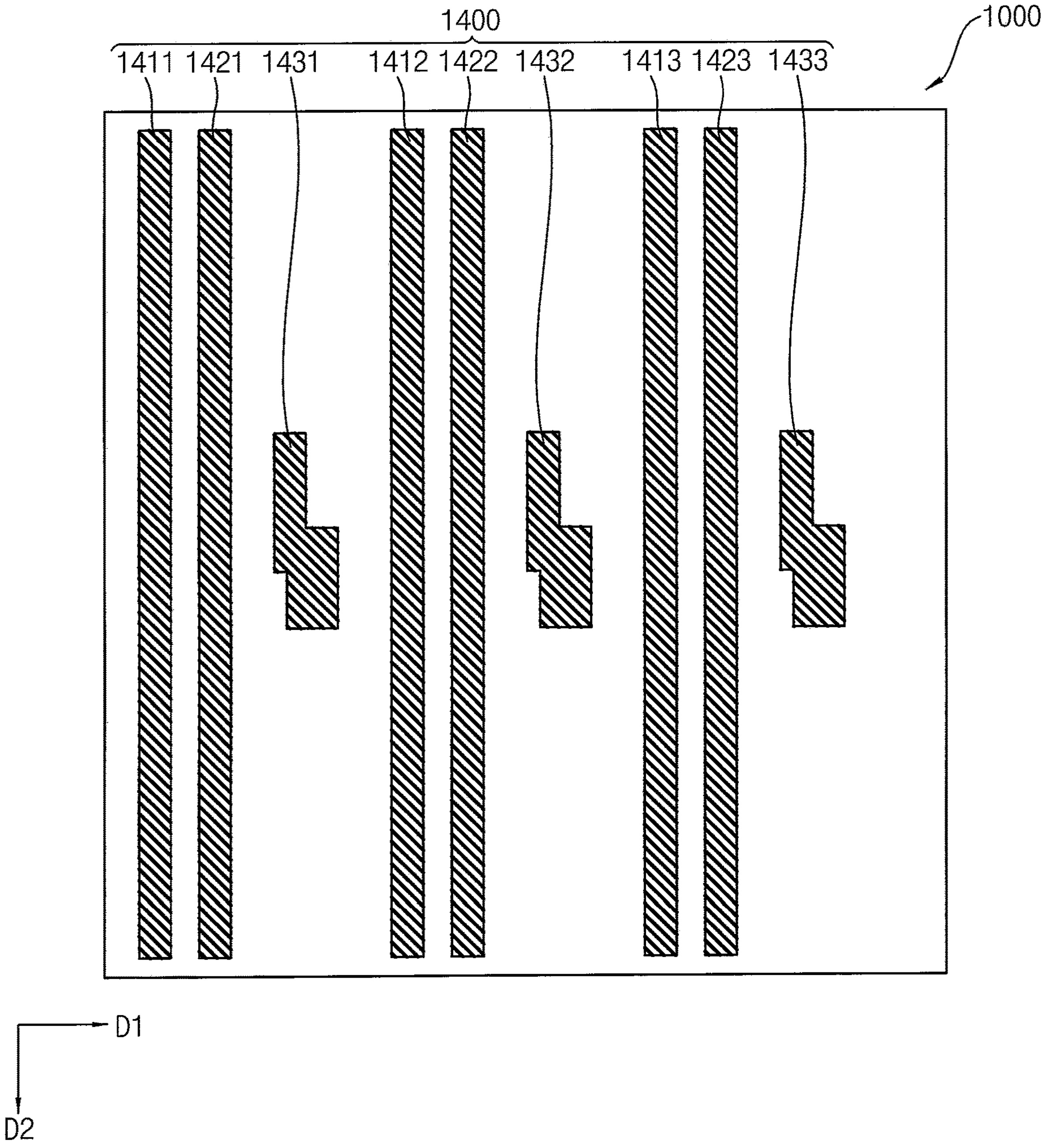
Figure 9:
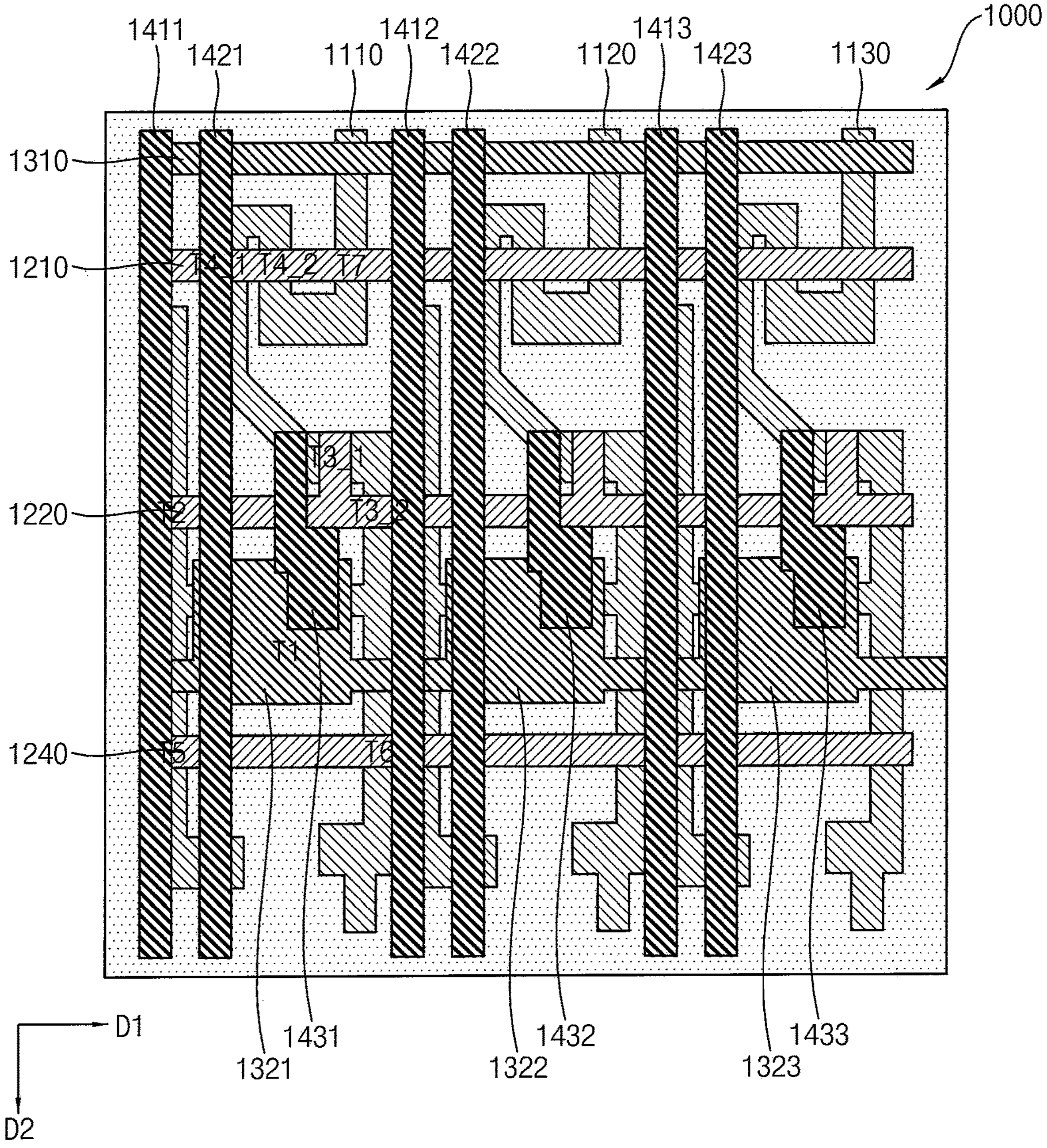

Referring to FIGS. 2, 8, and 9, a fourth pattern such as a fourth conductive pattern 1400 may be disposed on the third insulating layer. The fourth conductive pattern 1400 may partially overlap the first semi-conductive pattern 1100, the second conductive pattern 1200, and/or the third conductive pattern 1300 as shown in FIG. 9.

In an exemplary embodiment, the fourth conductive pattern 1400 may include a first data wire 1411, a first high power voltage wire 1421, a first connecting wire 1431, a second data wire 1412, a second high power voltage wire 1422, a second connecting wire 1432, a third data wire 1413, a third high power voltage wire 1423, and a third connecting wire 1433. The first data wire 1411, the first high power voltage wire 1421, the first connecting wire 1431, the second data wire 1412, the second high power voltage wire 1422, the second connecting wire 1432, the third data wire 1413, the third high power voltage wire 1423, and the third connecting wire 1433 may extend in the second direction D2. The first data wire 1411, the first high power voltage wire 1421, the first connecting wire 1431, the second data wire 1412, the second high power voltage wire 1422, the second connecting wire 1432, the third data wire 1413, the third high power voltage wire 1423, and the third connecting wire 1433 may be disposed along the first direction D1.

The first data wire 1411 may provide the data voltage to the second transistor T2 of the first sub-pixel SP1. The first high power voltage wire 1421 may provide the high power voltage to the fifth transistor T5 of the first sub-pixel SP1. The first connecting wire 1431 may contact the first gate electrode 1231 and may be electrically connect the first transistor T1 and the third transistors T3_1 and T3_2 of the first sub-pixel SP1.

The second data wire 1412 may provide the data voltage to the second transistor T2 of the second sub-pixel SP2. The second high power voltage wire 1422 may provide the high power voltage to the fifth transistor T5 of the second sub-pixel SP2. The second connecting wire 1432 may contact the second gate electrode 1232 and may be electrically connect the first transistor T1 and the third transistors T3_1 and T3_2 of the second sub-pixel SP2.

The third data wire 1413 may provide the data voltage to the second transistor T2 of the third sub-pixel SP3. The third high power voltage wire 1423 may provide the high power voltage to the fifth transistor T5 of the third sub-pixel SP3. The third connecting wire 1433 may contact the third gate electrode 1233 and may be electrically connect the first transistor T1 and the third transistors T3_1 and T3_2 of the third sub-pixel SP3.

The first data wire 1411, the first high power voltage wire 1421, the first connecting wire 1431, the second data wire 1412, the second high power voltage wire 1422, the second connecting wire 1432, the third data wire 1413, the third high power voltage wire 1423, and the third connecting wire 1433 may include a metal, an alloy, a conductive metal oxide, a transparent conductive material, or the like.

A fourth insulating layer (e.g., a via insulating layer VIA of FIG. 13) and first electrodes (e.g., first electrodes 3110 3120 of FIGS. 13 and 14) may be disposed on the fourth conductive pattern 1400.

The fourth insulating layer may cover the fourth conductive pattern 1400 and may be disposed to have a predetermined thickness along a profile of the fourth conductive pattern 1400. For example, the fourth insulating layer may include an inorganic material such as silicon oxide, silicon nitride, or metal oxide or an organic material such as photoresist, acrylic resin, polyimide resin, polyamide resin, or siloxane resin.

The first electrodes for the first to third sub-pixels SP1 to SP3 may be disposed on the fourth insulating layer. The first electrodes may have reflective or translucent properties. For example, the first electrodes may include aluminum (Al), an alloy containing aluminum, aluminum nitride (AlNx), silver (Ag), an alloy containing silver, tungsten (W), tungsten nitride (WNx), copper (Cu), alloy containing copper, nickel (Ni), chromium (Cr), chromium nitride (CrNx), molybdenum (Mo), alloy containing molybdenum, titanium (Ti), titanium nitride (TiNx), Platinum (Pt), tantalum (Ta), tantalum nitride (TaNx), neodymium (Nd), scandium (Sc), indium tin oxide (ITO), indium zinc oxide (IZO), and the like.

Referring to FIGS. 2, 10, and 11, the pixel defining layer 2000 may be disposed on the first electrodes. For example, the pixel defining layer 2000 may include an organic material such as photoresist, polyacrylic resin, polyimide resin, or acrylic resin. Alternatively, the pixel defining layer 2000 may include an inorganic material such silicon oxide or silicon nitride.

In addition, the pixel defining layer 2000 may include the first to third openings 2100, 2200, and 2300 overlapping the first electrodes, and the emission layers of the first to third sub-pixels SP1 to SP3 may be disposed on the first electrodes in the first to third openings 2100, 2200, and 2300. For example, the first emission layer may be disposed in the first opening 2100, the second emission layer may be disposed in the second opening 2200, and the third emission layer may be disposed in the third opening 2300. An emission area and a non-emission area of the display device 10 may be defined by the first to third openings 2100, 2200, and 2300. For example, an area overlapping the first to third openings 2100, 2200, and 2300 may be the emission area of the display device 10, and an area where the body of the pixel defining layer 2000 remains may be the non-emission area of the display device 10.

Figure 12:
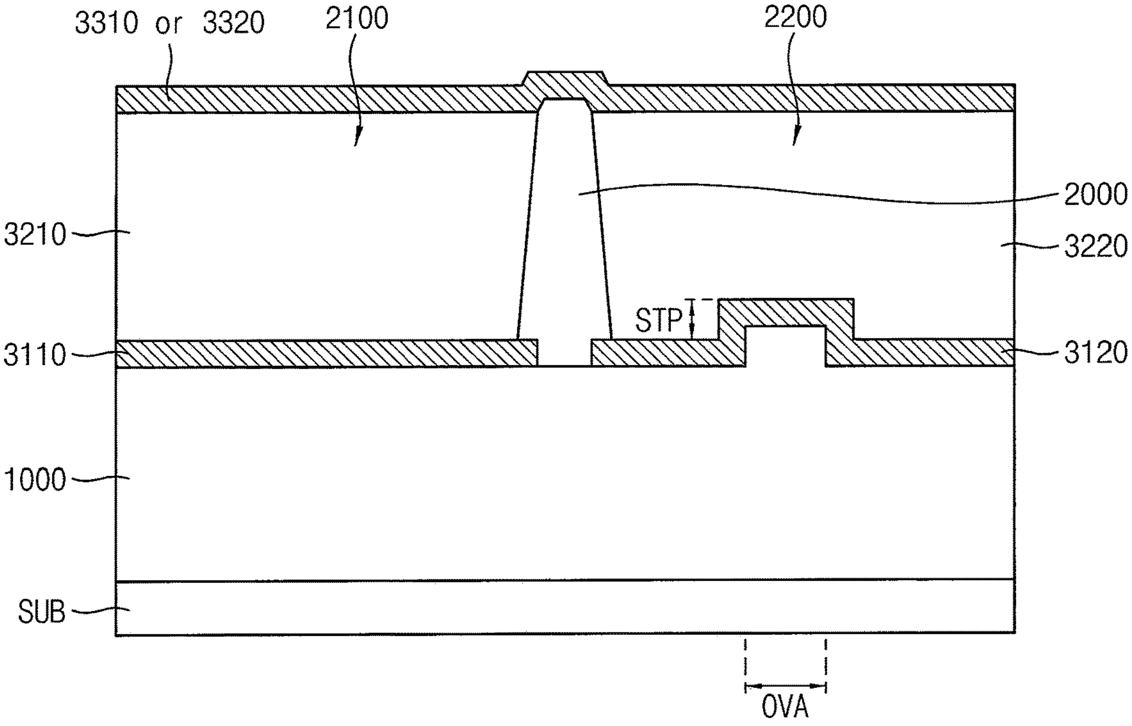
FIG. 12 is a cross-sectional view schematically illustrating an overlap area and a non-overlap area of the display device of FIG. 1.
Figure 13:
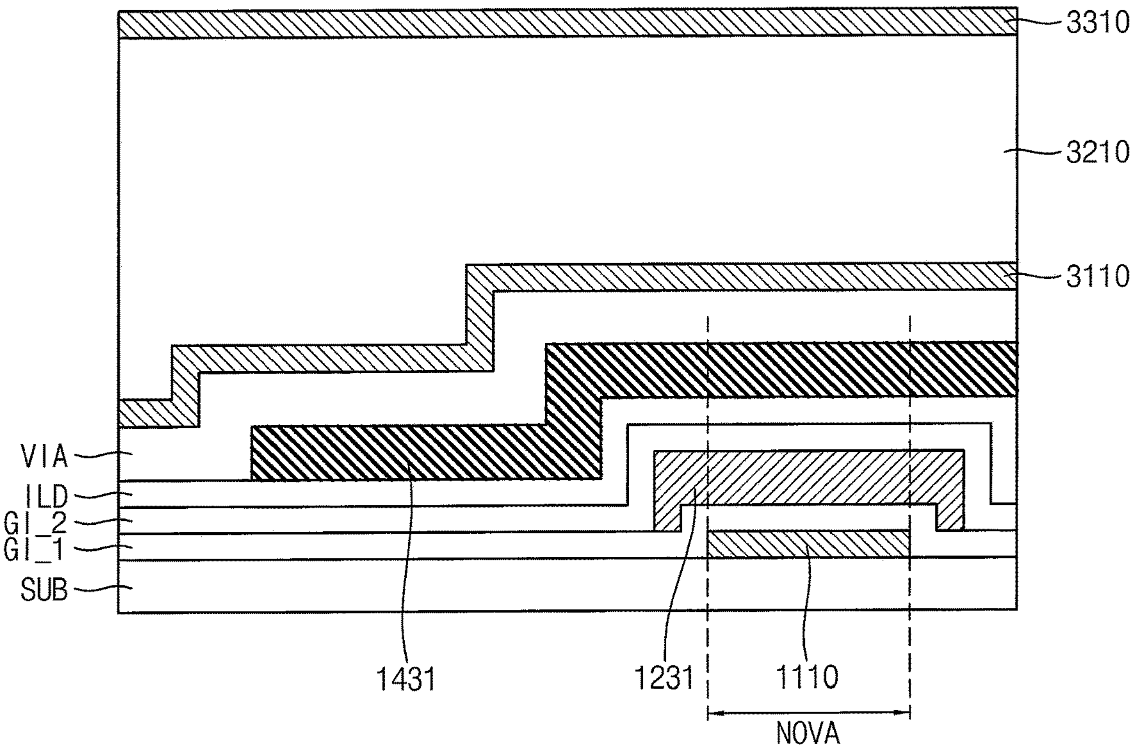
FIG. 13 is a cross-sectional view of a portion of the pixel of FIG. 2 including the non-overlap area.
Figure 14:
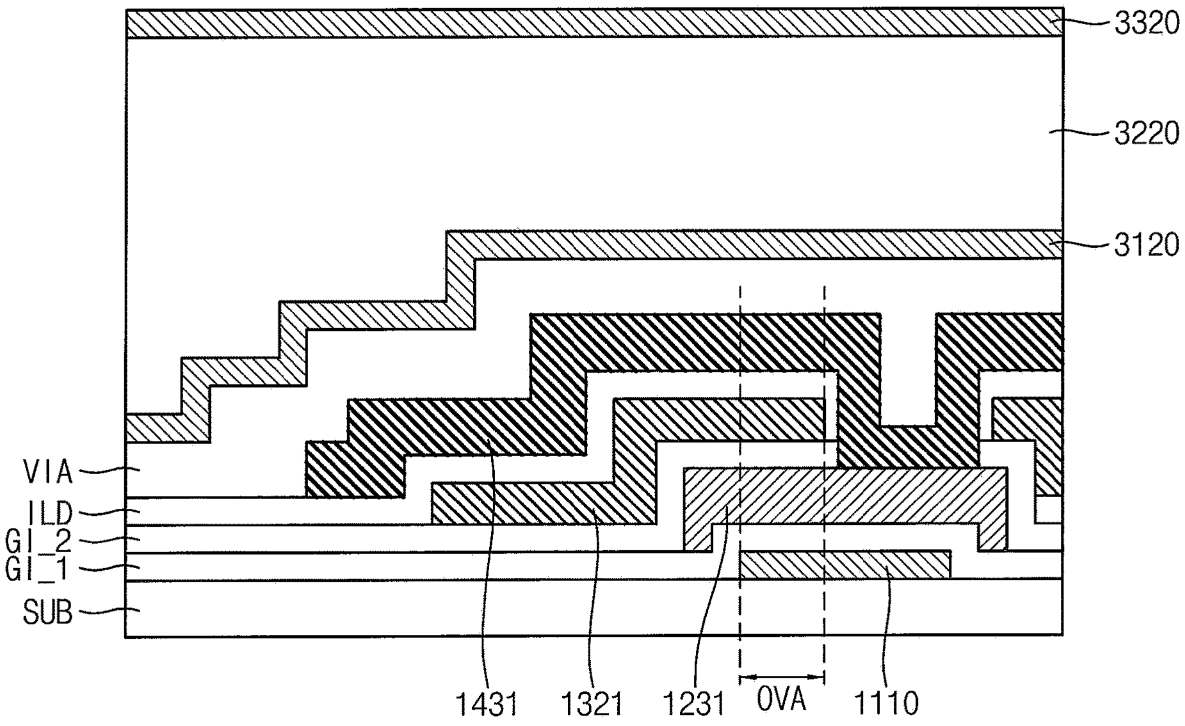
FIG. 14 is a cross-sectional view taken along line I-I' of FIG. 2 to illustrate another portion of the overlap area of the pixel of FIG. 2.

FIG. 12 is a cross-sectional view schematically illustrating an overlap area and a non-overlap area of the display device of FIG. 1. FIG. 13 is a cross-sectional view of a portion of the pixel of FIG. 2 including the non-overlap area. FIG. 14 is a cross-sectional view taken along line I-I' of FIG. 2 to illustrate another portion of the overlap area of the pixel of FIG. 2.

Referring to FIGS. 1, 2, 9, 12, 13, and 14, the substrate SUB, the first active pattern 1110, the first insulating layer GI_1, the first gate electrode 1231, the second insulating layer GI_2, the third insulating layer ILD, the first connecting wire 1431, the fourth insulating layer VIA, the first electrode 3110, the first emission layer 3210, and the second electrode 3310 may be sequentially disposed in a non-overlap area NOVA of FIG. 13 of the display device 10.

The substrate SUB, the first active pattern 1110, the first insulating layer GI_1, the first gate electrode 1231, the second insulating layer GI_2, the first capacitor electrode 1321, the third insulating layer ILD, the first connecting wire 1431, the fourth insulating layer VIA, the first electrode 3120, the second emission layer 3220, and the second electrode 3320 may be sequentially disposed in the overlap area OVA of the display device 10.

In an exemplary embodiment, the second electrode 3310 or 3320 may have a plate shape and may be integrally formed.

In an exemplary embodiment, the display device 10 may have a top emitting structure using a resonance phenomenon. For example, the top emitting structure may mean a structure in which lights emitted from the first to third emission layers proceed through the second electrode 3310 or 3320. The resonance phenomenon may mean a phenomenon in which a light proceeding to the second electrode 3310 or 3320 and a light reflected from the first electrode 3110 or 3120 interfere constructively with each other. To this end, the first electrode 3110 or 3120 may have reflective properties and the second electrode 3310 or 3320 may have translucent properties. As the thickness of each of the first to third emission layers is substantially constant and/or substantially uniform, the efficiency of the constructive interference may increase. In addition, as the thickness of each of the first to third emission layers is substantially constant and/or substantially uniform, the half-width of a spectrum of light emitted from each of the first to third emission layers may decrease. Accordingly, each of the first to third light emission layers may emit clearer light. Therefore, as the thickness of each of the first to third emission layers is substantially constant and/or substantially uniform, color characteristics of light emitted from each of the first to third emission layers may be improved, and the luminous efficiency and display quality of the display device 10 may be increased.

As described above, the step STP may be formed on the bottom surface of the second emission layer 3220 due to the step STP around the overlap area OVA. In addition, the top surface of the second emission layer 3210 may be substantially flat. Accordingly, the thickness of the second emission layer 3220 may not be substantially constant and/or substantially uniform.

In an exemplary embodiment, the first emission layer 3210 may overlap the non-overlap area NOVA without overlapping the overlap area OVA, and the second emission layer 3220 may overlap the overlap area OVA. The degree of change in the thickness of the first emission layer 3210 due to the step STP may be smaller than the degree of change in the thickness of the second emission layer 3220. In other words, an amount of change in the thickness of the first emission layer 3210 may be less than an amount of change in the thickness of the second emission layer 3220. Accordingly, the color characteristics of light emitted from the first emission layer 3210 may be improved compared with the color characteristics of light emitted from the second emission layer 3220.

In an exemplary embodiment, the first emission layer 3210 may emit a light having a blue color, the second emission layer 3220 may emit a light having a red color, and the third emission layer may emit a light having a green color. For example, in order for the pixel PX to display white, the first sub-pixel SP1 may emit blue light, the second sub-pixel SP2 may emit red light, and the third sub-pixel SP3 may emit green light.

The following <Table 1> includes data obtained by measuring a luminance of white light according to the luminance of blue light, red light, and green light.

TABLE 1

(unit: %)

| | Blue color | Red color | Green color | White color |
|---|---|---|---|---|
| Reference luminance | 100 | 100 | 100 | 100 |
| Change of luminance of light having a blue color | 90 | 100 | 100 | 94 |
| Change of luminance of light having a red color | 100 | 90 | 100 | 98 |
| Change of luminance of light having a green color | 100 | 100 | 90 | 97 |

Referring to Table 1, when the luminance of light having the blue color is set to 100% (i.e., the brightness of light having the blue color is set to maximum), the luminance of light having a red color is set to 100%, and the luminance of light having a green color is set to 100%, the luminance of white light was 100%. On the other hand, when the luminance of light having the blue color is reduced by 10%, the luminance of white light is reduced to 94%. When the luminance of light having the red color is reduced by 10%, the luminance of white light was reduced to 98%. When the luminance of light having the green color is reduced by 10%, the luminance of white light was reduced to 97%. In other words, Applicant discovered that the rate of change in luminance of white light was most affected by the rate of change in luminance of light having the blue color.

The following <Table 2> is data obtained by measuring a color coordinate of white light according to the color coordinate changes of blue, red, and green.

TABLE 2

| | Blue color | Red color | Green color | White color (%) |
|---|---|---|---|---|
| Reference color coordinate | 0.06 | 0.68 | 0.26 | 100(full white) |
| Change of color coordinate of blue color | 0.07 | 0.68 | 0.26 | 91 |
| Change of color coordinate of red color | 0.06 | 0.78 | 0.26 | 100 |
| Change of color coordinate of green color | 0.06 | 0.68 | 0.36 | 100 |

Referring to Table 2, when the color coordinate of blue color is set to 0.06, the color coordinate of red color is set to 0.68, and the color coordinate of green color is set to 0.26, the pixel (PX) displayed 100% white (i.e., full white). When the color coordinate of red color is increased by 0.01, the pixel PX displayed 100% white. When the color coordinate of green color is increased by 0.01, the pixel PX displayed 100% white. On the other hand, when the color coordinate of blue color is increased by 0.01, the pixel PX displayed 91% white. In other words, Applicant discovered that the rate of change of the color coordinates of white was most affected by a rate of change of the color coordinate of blue color.

According to exemplary embodiments, the first emission layer 3210 to emit the light having the blue color may be disposed in the first opening 2100 that does not overlap the overlap area OVA, and therefore the color characteristic of blue color may be improved. Accordingly, the color characteristic of white light displayed by the pixel PX may be improved and display quality of the display device 10 may be improved.

In addition, in an exemplary embodiment, an area of the first opening 2100 may be larger than an area of the second opening 2200 and may be larger than an area of the third opening 2300. The area of the second opening 2200 may be substantially the same as the area of the third opening 2300. Accordingly, the aperture ratio of the first emission layer disposed in the first opening 2100 may be larger than the aperture ratio of the second emission layer disposed in the second opening 2200 and may be larger than the aperture ratio of the third emission layer disposed in the third opening 2300. Accordingly, the amount of a driving current per unit area required for the first emission layer to emit the light of a certain luminance may be relatively low. Therefore, the life span of the first emission layer may be improved.

Figure 15:
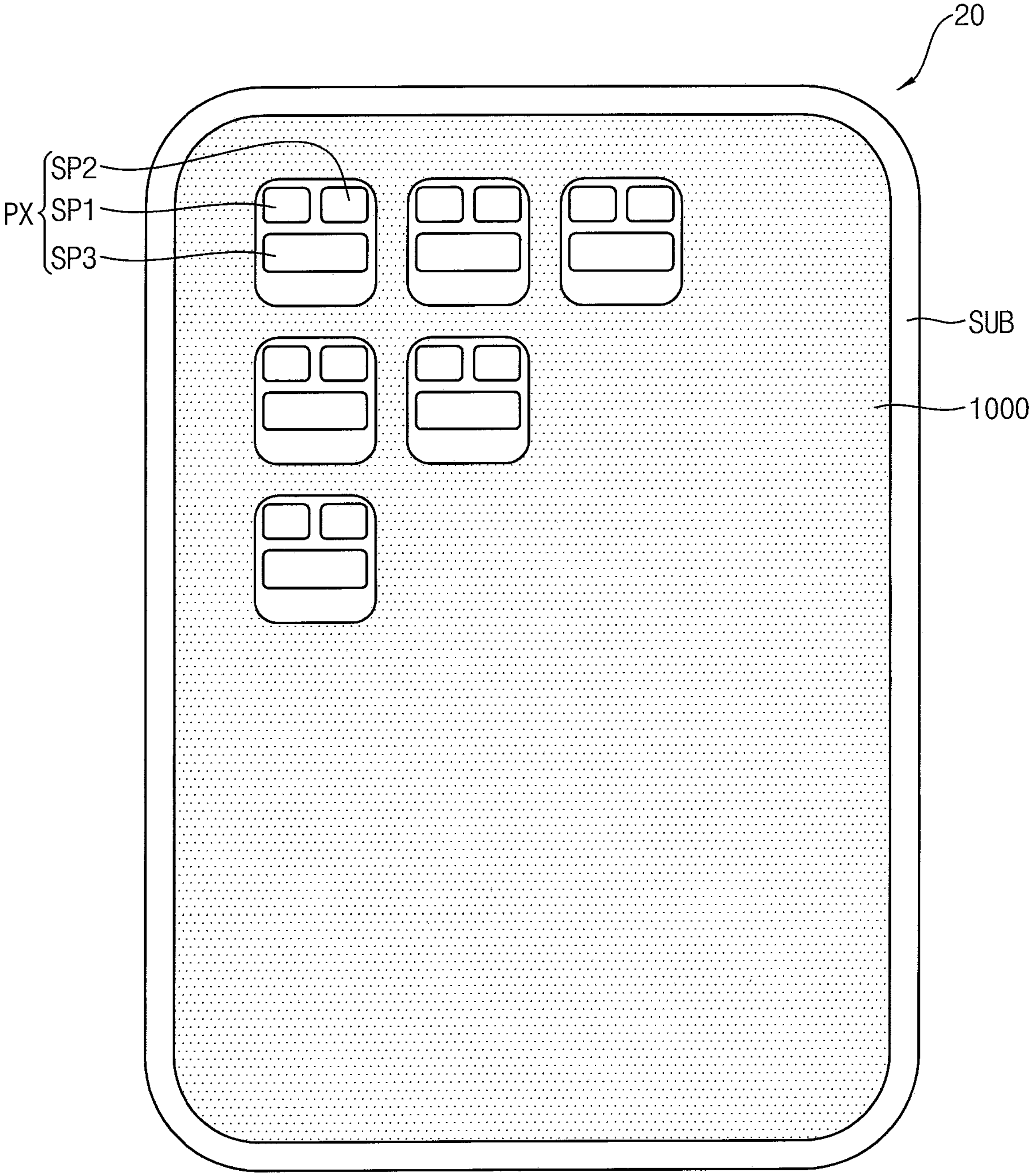
FIG. 15 is a plan view of another exemplary embodiment of a display device constructed according to the principles of the invention.
Figure 16:
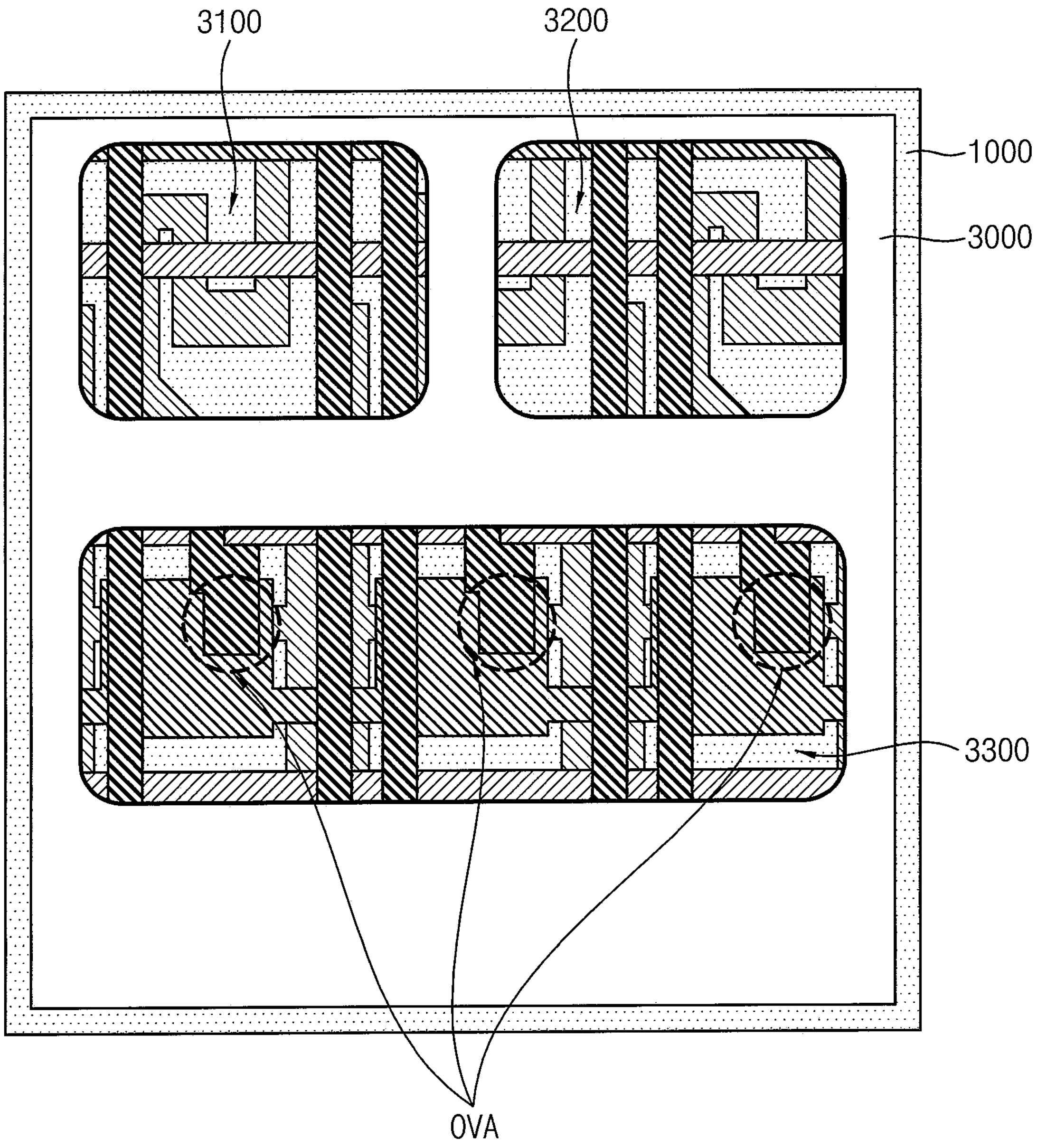
FIG. 16 is a plan view of an exemplary embodiment of some of layers of the pixel of FIG. 15.
Figure 17:
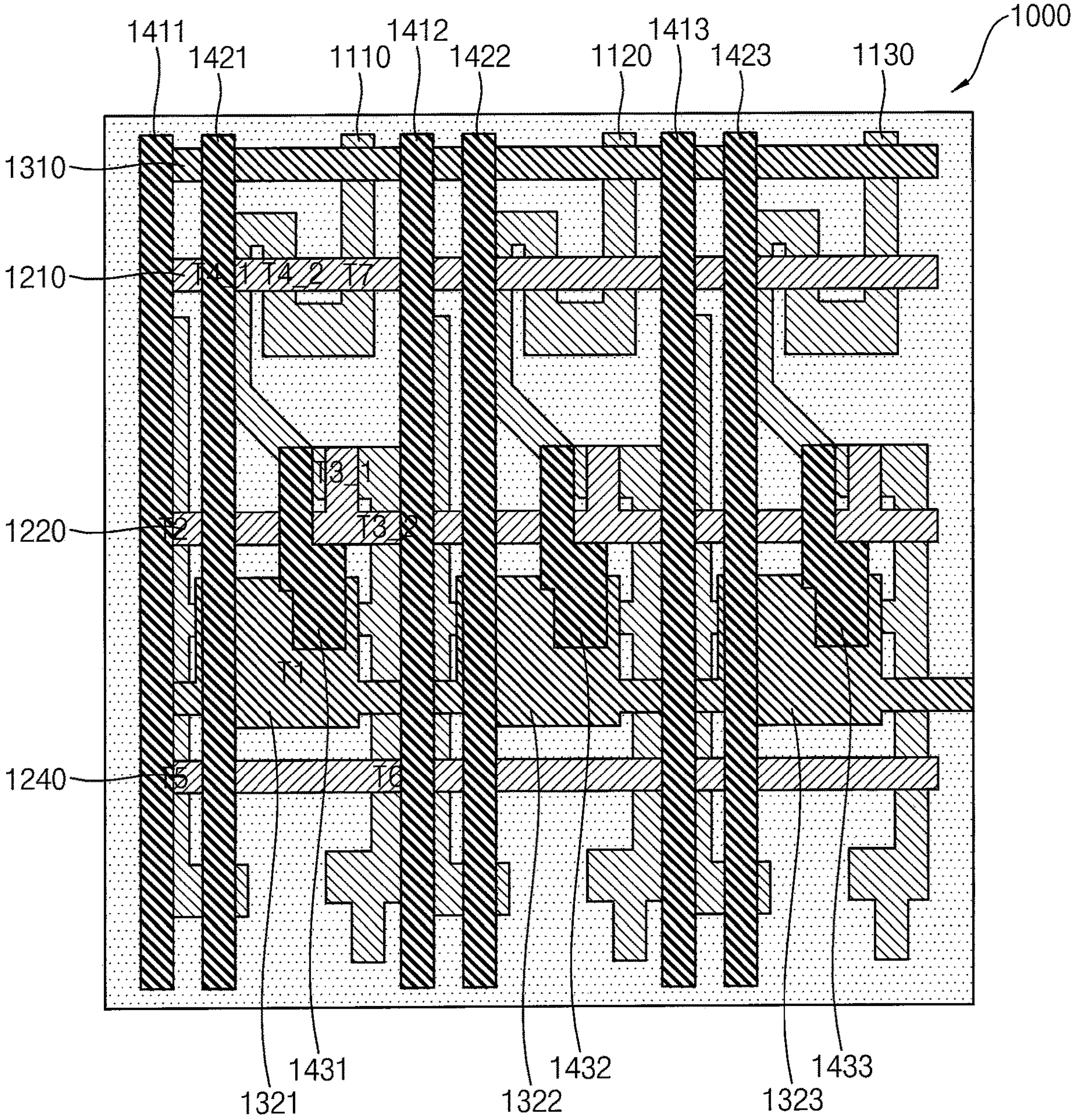
FIG. 17 is a plan view of some of layers of the wiring layer of FIG. 16.
Figure 18:
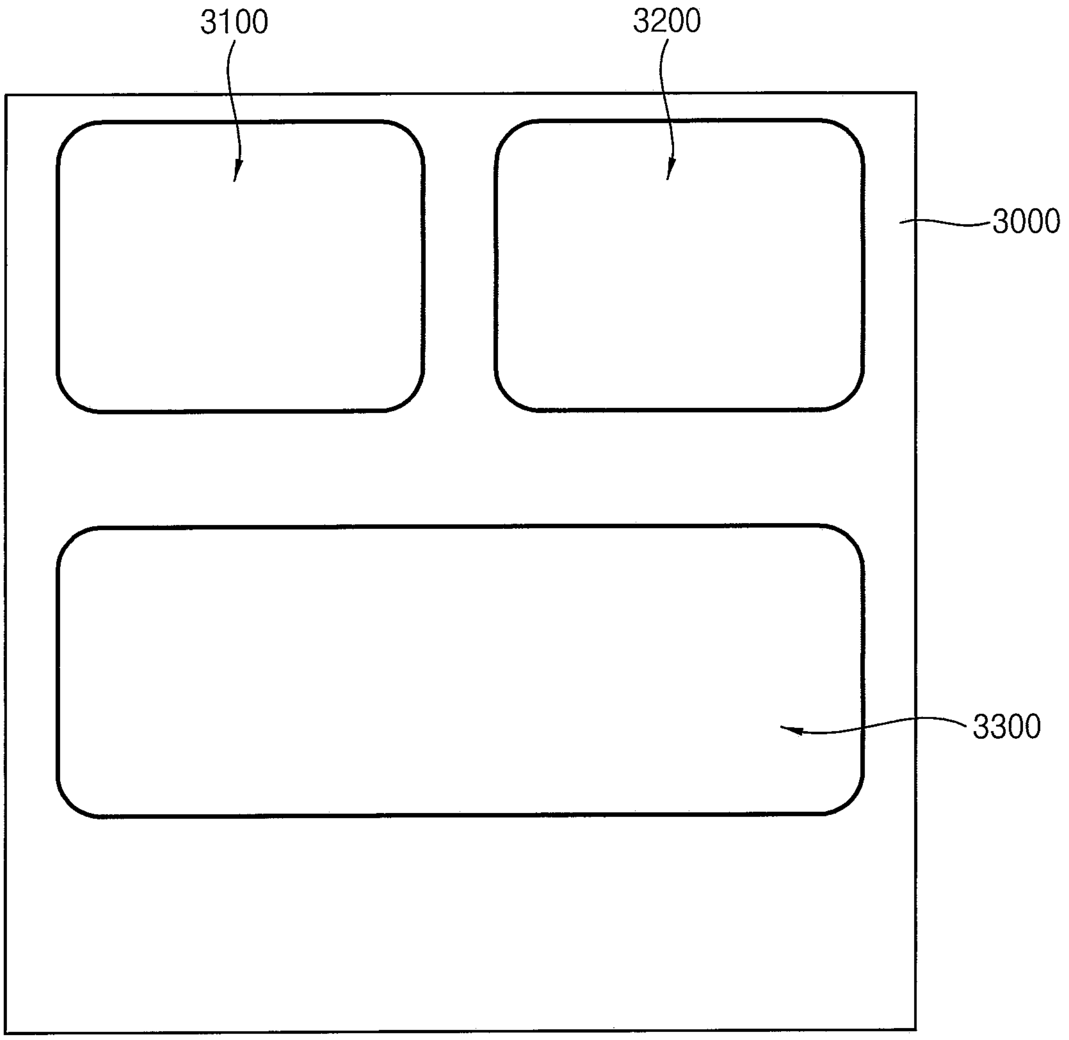
FIG. 18 is a plan view of the pixel defining layer of FIG. 16.

FIG. 15 is a plan view of another exemplary embodiment of a display device constructed according to the principles of the invention. FIG. 16 is a plan view of an exemplary embodiment of some of layers of the pixel of FIG. 15. FIG. 17 is a plan view of some of layers of the wiring layer of FIG. 16. FIG. 18 is a plan view of the pixel defining layer of FIG. 16.

Referring to FIGS. 15 to 18, a display device 20 may include a substrate SUB, a wiring layer 1000, and a pixel defining layer 3000. The wiring layer 1000 may be disposed on the substrate SUB and the pixel defining layer 3000 may be disposed on the wiring layer 1000. The pixel defining layer 3000 may include first to third openings 3100, 3200, and 3300.

The display device 20 is substantially the same as the display device 10 described above, except for positions and areas of the first to third openings 3100, 3200, and 3300. Hereinafter, the positions and areas of the first to third openings 3100, 3200, and 3300 will be described without repetitive descriptions to avoid redundancy.

The pixel defining layer 3000 may be disposed on the wiring layer 1000. The pixel defining layer 3000 may include the first to third openings 3100, 3200, and 3300 penetrating the body of the pixel defining layer 3000. For example, a first emission layer may be disposed in the first opening 3100, a second emission layer may be disposed in the second opening 3200, and a third light emitting layer may be disposed in the third opening 3300.

In an exemplary embodiment, the first opening 3100 may not overlap the overlap area OVA. The second opening 3200 may not overlap the overlap area OVA and may be spaced apart from the first opening 3100. The third opening 3300 may overlap the overlap area OVA and may be spaced apart from the first and second openings 3100 and 3200.

In this case, the step may be formed on a bottom surface of the third emission layer due to the step around the overlap area OVA. In addition, the top surface of the third emission layer may be substantially flat. Accordingly, the thickness of the third emission layer may not be substantially constant and/or substantially uniform. Accordingly, the degree of change in the thickness of the first emission layer may be smaller than the degree of change in the thickness of the third emission layer and the degree of change in the thickness of the second emission layer may be smaller than the degree of the change in the thickness of the third emission layer. In other words, the amount of change in the thickness of the first emission layer may be smaller than the amount of the change in the thickness of the third emission layer and the amount of the change in the thickness of the second emission layer may be smaller than the amount of the change in the thickness of the third emission layer. Accordingly, color characteristics of light emitted from the first and second emission layers may be improved compared with the color characteristics of light emitted from the third emission layer.

In an exemplary embodiment, the first emission layer may emit light having a blue color, the second emission layer may emit light having a red color, and the third emission layer may emit light having a green color. For example, in order for the pixel PX to display white, the first sub-pixel SP1 may emit blue light, the second sub-pixel SP2 may emit red light, and the third sub-pixel SP3 may emit green light.

According to exemplary embodiments, the first emission layer to emit the light having the blue color may be disposed in the first opening 3100 and the second emission layer to emit the light of the red color may be disposed in the second opening 320 where the first and second openings 3100 and 3200 do not overlap the overlap area OVA, and therefore the color characteristic of the blue and red colors may be improved. Accordingly, the color characteristic of white displayed by the pixel PX may be improved and display quality of the display device 20 may be improved.

In addition, in an exemplary embodiment, the area of the third opening 3300 may be larger than the area of the first opening 3100 and may be larger than the area of the second opening 3200. The area of the first opening 3100 may be substantially the same as the area of the second opening 3200. Accordingly, the aperture ratio of the third emission layer disposed in the third opening 3300 may be larger than the aperture ratio of the first emission layer disposed in the first opening 3100 and may be larger than the aperture ratio of the second emission layer disposed in the second opening 3200. Accordingly, the amount of a driving current per unit area required for the third emission layer to emit the light of a certain luminance may be relatively low. Therefore, the life span of the third emission layer may be improved.

In another exemplary embodiment, the first emission layer may emit blue light, the second emission layer may emit green light, and the third emission layer may emit red light.

Figure 19:
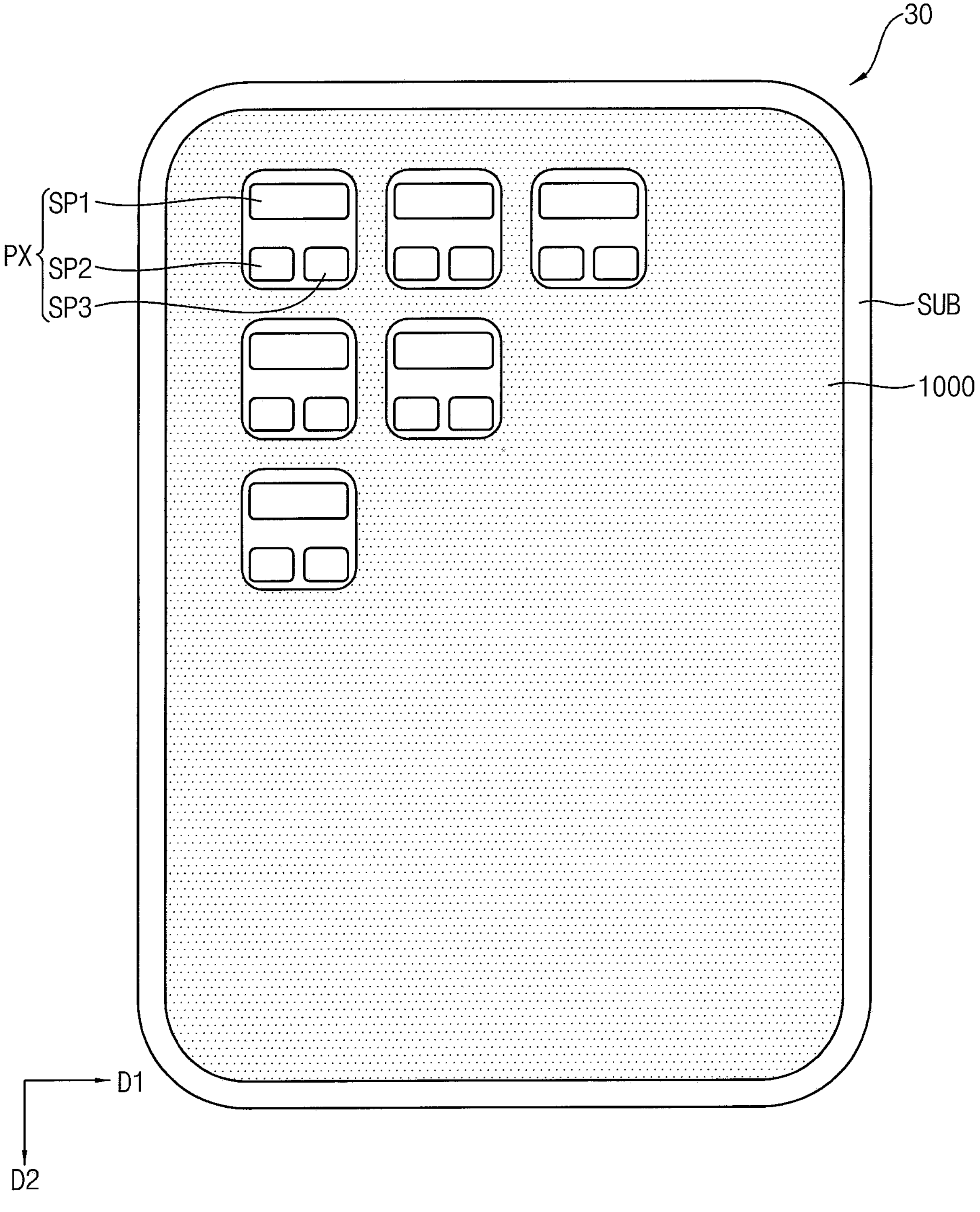
FIG. 19 is a plan view of still another exemplary embodiment of a display device constructed according to the principles of the invention.
Figure 20:
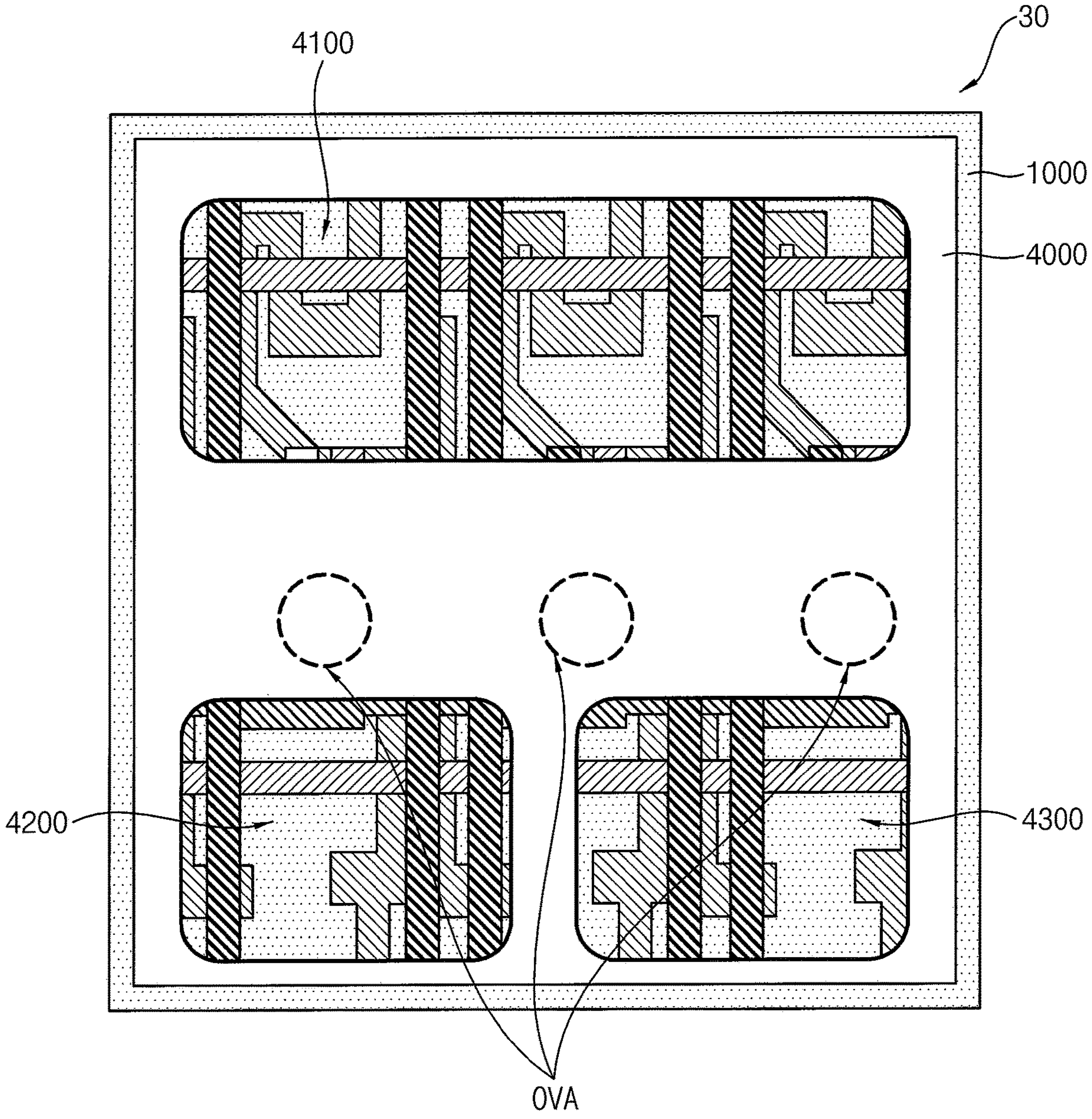
FIG. 20 is a plan view of an exemplary embodiment of some of layers of the pixel of FIG. 19.
Figure 21:
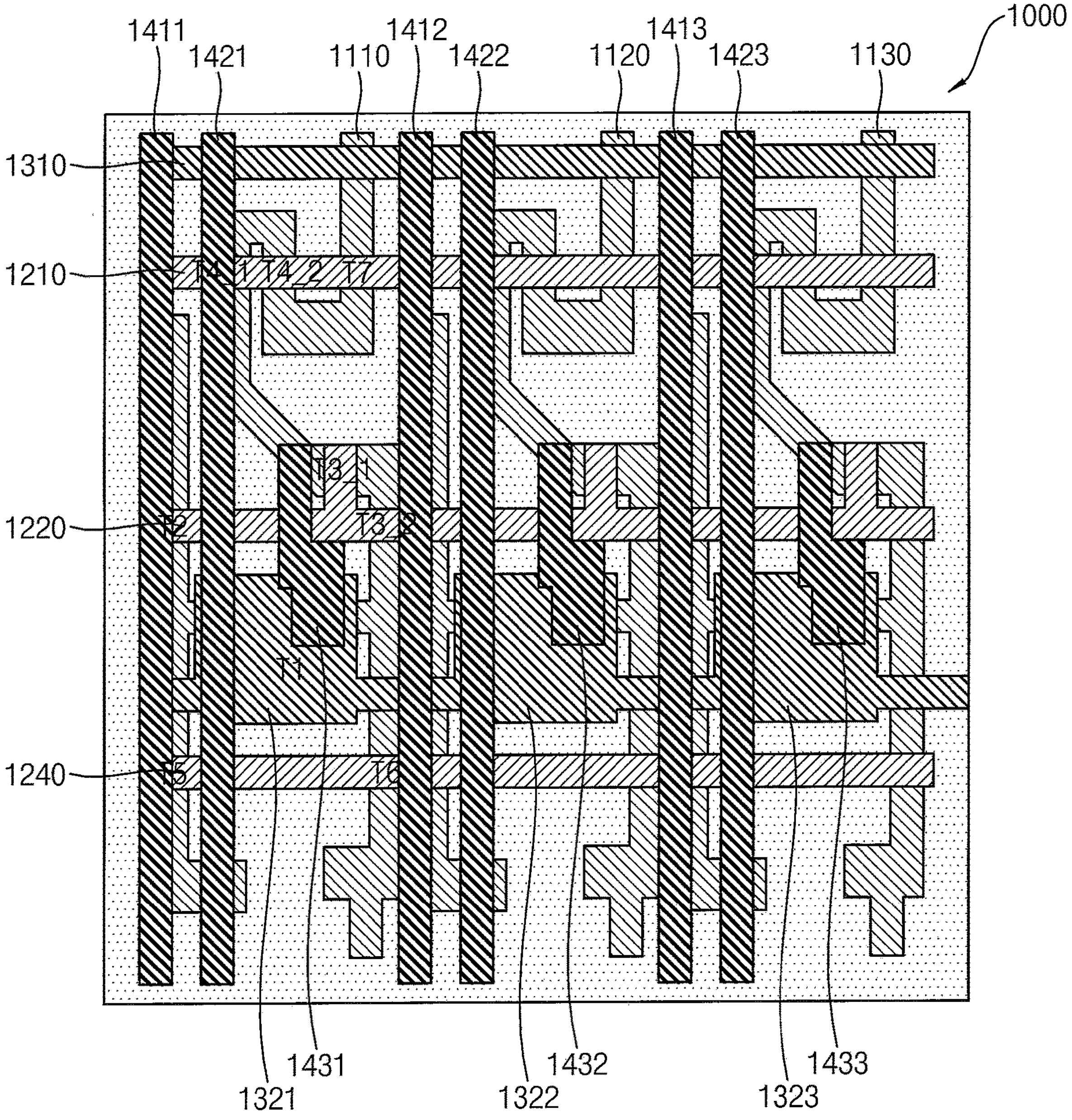
FIG. 21 is a plan view of some of layers of the wiring layer of FIG. 20.
Figure 22:
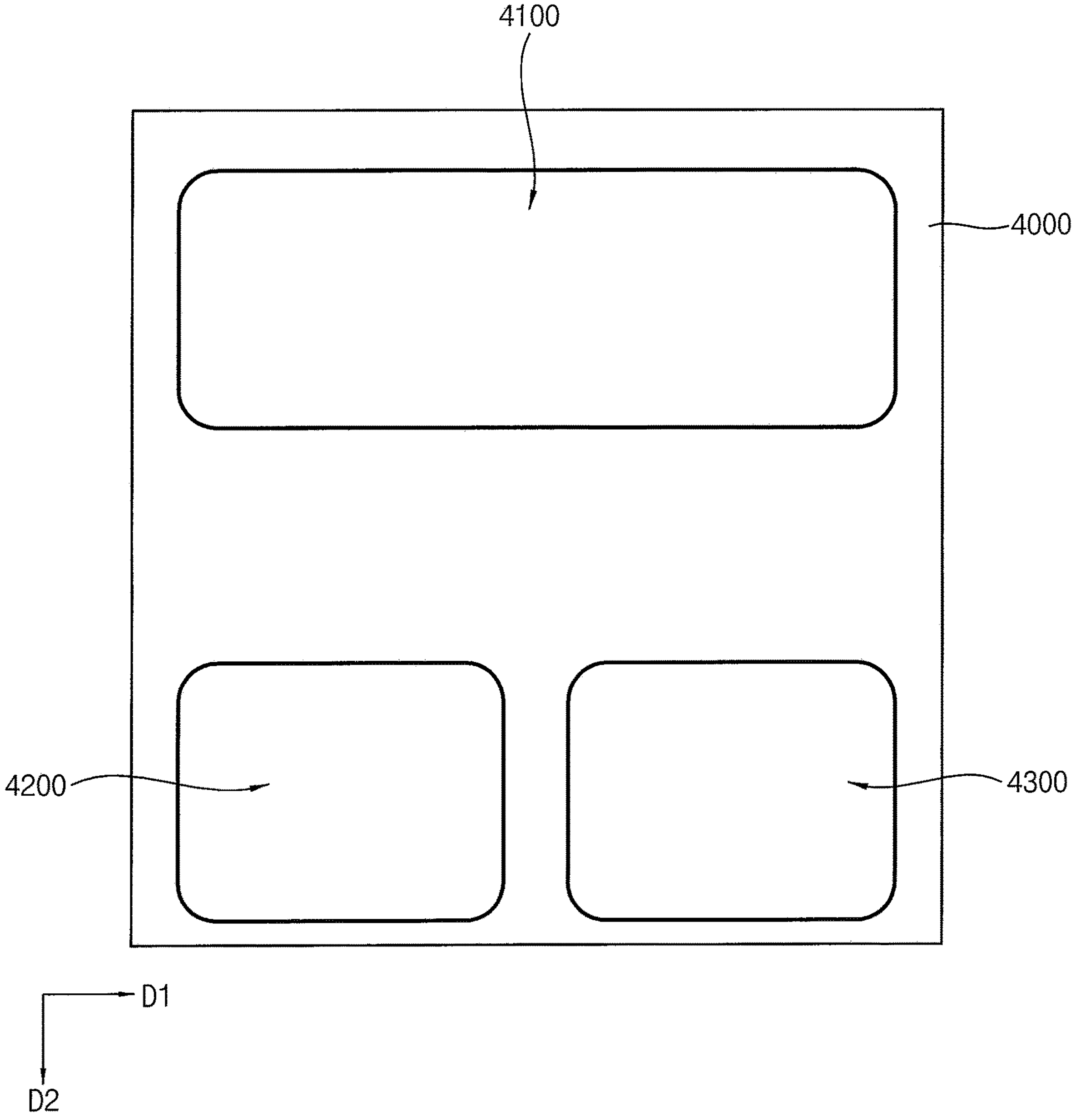
FIG. 22 is a plan view of the pixel defining layer of FIG. 20.

FIG. 19 is a plan view of still another exemplary embodiment of a display device constructed according to the principles of the invention. FIG. 20 is a plan view of an exemplary embodiment of some of layers of the pixel of FIG. 19. FIG. 21 is a plan view of some of layers of the wiring layer of FIG. 20. FIG. 22 is a plan view of the pixel defining layer of FIG. 20.

Referring to FIGS. 19 to 22, a display device 30 may include a substrate SUB, a wiring layer 1000, and a pixel defining layer 4000. The wiring layer 1000 may be disposed on the substrate SUB and the pixel defining layer 4000 may be disposed on the wiring layer 1000. The pixel defining layer 4000 may include first to third openings 4100, 4200, and 4300.

The display device 20 is substantially the same as the display device 10 described above, except for positions of the first to third openings 3100, 3200, and 3300. Hereinafter, the positions of the first to third openings 3100, 3200, and 3300 will be described without repetitive descriptions to avoid redundancy.

The pixel defining layer 4000 may be disposed on the wiring layer 1000. The pixel defining layer 4000 may include the first to third openings 4100, 4200, and 4300 penetrating the body of the pixel defining layer 4000. For example, a first emission layer may be disposed in the first opening 4100, a second emission layer may be disposed in the second opening 4200, and a third light emitting layer may be disposed in the third opening 4300.

In an exemplary embodiment, the first to third openings 4100, 4200, and 4300 may not overlap the overlap area OVA. In other words, the body of the pixel defining layer 4000 may overlap the overlap area OVA.

In this case, the step STP may be formed on the bottom surface of the pixel defining layer 4000 due to the step STP around the overlap area OVA. Accordingly, each degree of change in the thickness of the first to third emission layers may be relatively reduced. Therefore, color characteristics of each of the lights emitted from the first to third emission layers may be improved.

In an exemplary embodiment, the first emission layer may emit light having a blue color, the second emission layer may emit light having a red color, and the third emission layer may emit light having a green color. For example, in order for the pixel PX to display white, the first sub-pixel SP1 may emit blue light, the second sub-pixel SP2 may emit red light, and the third sub-pixel SP3 may emit green light.

According to exemplary embodiments, the first to third emission layers may be disposed in the first to third openings 4100, 4200, and 4300 that does not overlap the overlap area OVA, the color characteristics of blue color, red color, and green color may be improved. Accordingly, the color characteristic of white displayed by the pixel PX may be improved and display quality of the display device 30 may be improved.

In addition, in an exemplary embodiment, the area of the first opening 4100 may be larger than the area of the second opening 4200 and may be larger than the area of the third opening 4300. The area of the second opening 4200 may be substantially the same as the area of the third opening 4300. Accordingly, the aperture ratio of the first emission layer disposed in the first opening 4100 may be larger than the aperture ratio of the second emission layer disposed in the second opening 4200 and may be larger the a aperture ratio of the third emission layer disposed in the third opening 4300. Accordingly, the amount of driving current per unit area required for the first emission layer to emit the light of a certain luminance may be relatively low. Therefore, the life span of the first emission layer may be improved.

The principles of the invention may applied to various exemplary embodiments of the display devices and electronic devices including the display devices. For example, the exemplary embodiments of display devices constructed according to the principles of the invention may be applied to or take the form of a cellular phone, a smart phone, a video phone, a smart pad, a smart watch, a tablet PC, a car navigation system, a television, a computer monitor, a laptop or notebook computer, a head mounted display device, an MP3 player, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device including a pixel having a red or green subpixel in a first area and a blue subpixel in a second area, the display device comprising:

a substrate;

a first pattern above the substrate;

a conductive second pattern above the first pattern;

a conductive third pattern above the conductive second pattern, and comprising an initialization voltage wire;

a conductive fourth pattern above the conductive third pattern, wherein the first pattern, the conductive second pattern, the conductive third pattern, and the conductive fourth pattern overlap each other in an overlap area of the first area of the pixel;

a pixel defining layer above the conductive fourth pattern, and defining a first opening overlapping the second area of the pixel without overlapping the first area; and a first emission layer located in the first opening and configured to emit light having a blue color, wherein each of the conductive third and fourth patterns is entirely conductive, wherein the pixel defining layer further defines:

a second opening overlapping the overlap area of the first area and being spaced apart from the first opening; and a third opening overlapping the overlap area of the first area and being spaced apart from the first opening and the second opening, wherein an area of the first opening is larger than an area of the second opening and is larger than an area of the third opening, wherein a sum of the area of the second opening and the area of the third opening is smaller than the area of the first opening, wherein the display device further comprises:

a second emission layer configured to emit light having a red color, and located in the second opening; and a third emission layer configured to emit light having a green color, and located in the third opening, and wherein the second emission layer comprises an indented portion defined by a step formed at a bottom surface of the second emission layer overlapping the overlap area of the first area, a thickness of the indented portion being less than a thickness of surrounding portions of the second emission layer not overlapping the overlap area.

2. The display device of claim 1, wherein an area of the second opening has a same size as an area of the third opening.

3. The display device of claim 1, wherein the first to third emission layers have top surfaces that are substantially flat.

4. The display device of claim 1, wherein the second opening does not overlap the overlap area, and.

5. The display device of claim 4, wherein the first opening has a third area, wherein the second opening has a fourth area, and wherein the third opening has a fifth area that is larger than the third area and larger than the fourth area.

6. The display device of claim 4, wherein the first opening has a third area, wherein the second opening has a fourth area, wherein the third opening has a fifth area, wherein the third area is substantially equal to the fourth area.

7. The display device of claim 1, wherein the first opening has a third area, wherein the second opening has a fourth area, wherein the third opening has a fifth area, and wherein the third area is larger than the fourth area and is larger than the fifth area.

8. The display device of claim 1, wherein the first opening has a third area, wherein the second opening has a fourth area, and wherein the third opening has a fifth area that is substantially equal to the fourth area.

9. The display device of claim 1, wherein the first pattern comprises an active pattern of a driving transistor of the pixel, wherein the conductive second pattern includes a gate electrode of the driving transistor, wherein the conductive third pattern includes a capacitor electrode constituting a capacitor together with the gate electrode, and wherein the conductive fourth pattern includes a connecting wire connecting the driving transistor and a compensation transistor of the pixel.

10. The display device of claim 9, wherein the conductive fourth pattern contacts the conductive second pattern.

11. The display device of claim 10, wherein the capacitor electrode includes a hole overlapping the conductive second and fourth patterns, and wherein the conductive fourth pattern contacts the conductive second pattern through the hole.

* * * * *